United States Patent
Murakami et al.

(10) Patent No.: US 6,486,460 B1
(45) Date of Patent: Nov. 26, 2002

(54) SOLID-STATE IMAGE SENSING DEVICE AND METHOD OF DRIVING THE SAME

(75) Inventors: Ichiro Murakami, Tokyo (JP); Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/394,344

(22) Filed: Sep. 13, 1999

(30) Foreign Application Priority Data

Sep. 11, 1998 (JP) .......................................... 10-257743

(51) Int. Cl.⁷ .............................................. H01L 27/00
(52) U.S. Cl. .................................... 250/208.1; 348/299
(58) Field of Search .......................... 250/208.1, 208.4, 250/208.5; 348/279, 294, 314; 257/443, 444, 250, 291; 438/78

(56) References Cited

U.S. PATENT DOCUMENTS

| | | | | |
|---|---|---|---|---|
| 4,977,312 A | * | 12/1990 | Juen | 250/208.1 |
| 5,057,926 A | * | 10/1991 | Watanabe | 358/213.11 |
| RE34,802 E | * | 11/1994 | Sayag | 250/208.1 |
| 6,040,570 A | * | 3/2000 | Levine et al. | 250/208.1 |

FOREIGN PATENT DOCUMENTS

| | | |
|---|---|---|
| JP | 57-99876 | 6/1982 |
| JP | 58-60882 | 4/1983 |
| JP | 60-13778 | 1/1985 |
| JP | 60-20687 | 2/1985 |
| JP | 61-274475 | 12/1986 |
| JP | 62-157479 | 7/1987 |
| JP | 2-134986 | 5/1990 |
| JP | 3-94585 | 4/1991 |
| JP | 4-168882 | 6/1992 |
| JP | 4-168886 | 6/1992 |
| JP | 4-168887 | 6/1992 |
| JP | 4-168888 | 6/1992 |
| JP | 4-168889 | 6/1992 |
| JP | 4-168895 | 6/1992 |
| JP | 7-284025 | 10/1995 |
| JP | H7-284025 | 10/1995 |
| JP | 8-9259 | 1/1996 |
| JP | 8-9252 | 2/1996 |
| JP | 10-150183 | 6/1998 |

* cited by examiner

Primary Examiner—Que T. Le
Assistant Examiner—Thanh X. Luu
(74) Attorney, Agent, or Firm—Sughrue Mion, LLP

(57) ABSTRACT

A solid-state image sensing device having: a plurality of sensing means arrayed in the form of a matrix; a charge accumulation means that is connected to the sensing means and accumulates a charge generated at the sensing means; an accumulable charge adjusting means that adjusts the amount of accumulable charge of the charge accumulation means; and a control means that controls the accumulable charge adjusting means. The control means controls the amount of accumulable charge to vary continuously or discontinuously in time series within one imaging period and within a given amount of accumulable charge of the control means.

15 Claims, 18 Drawing Sheets

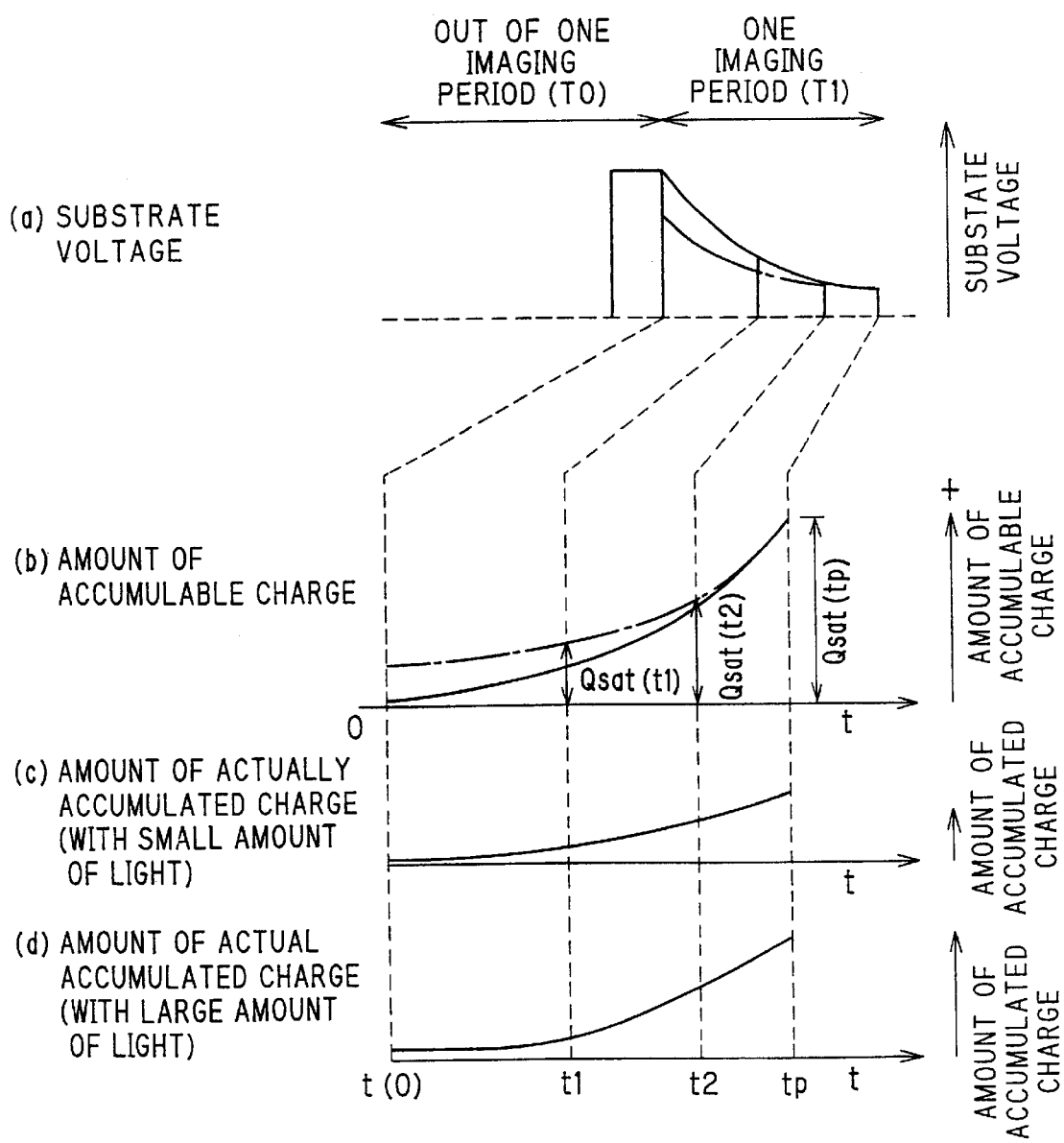

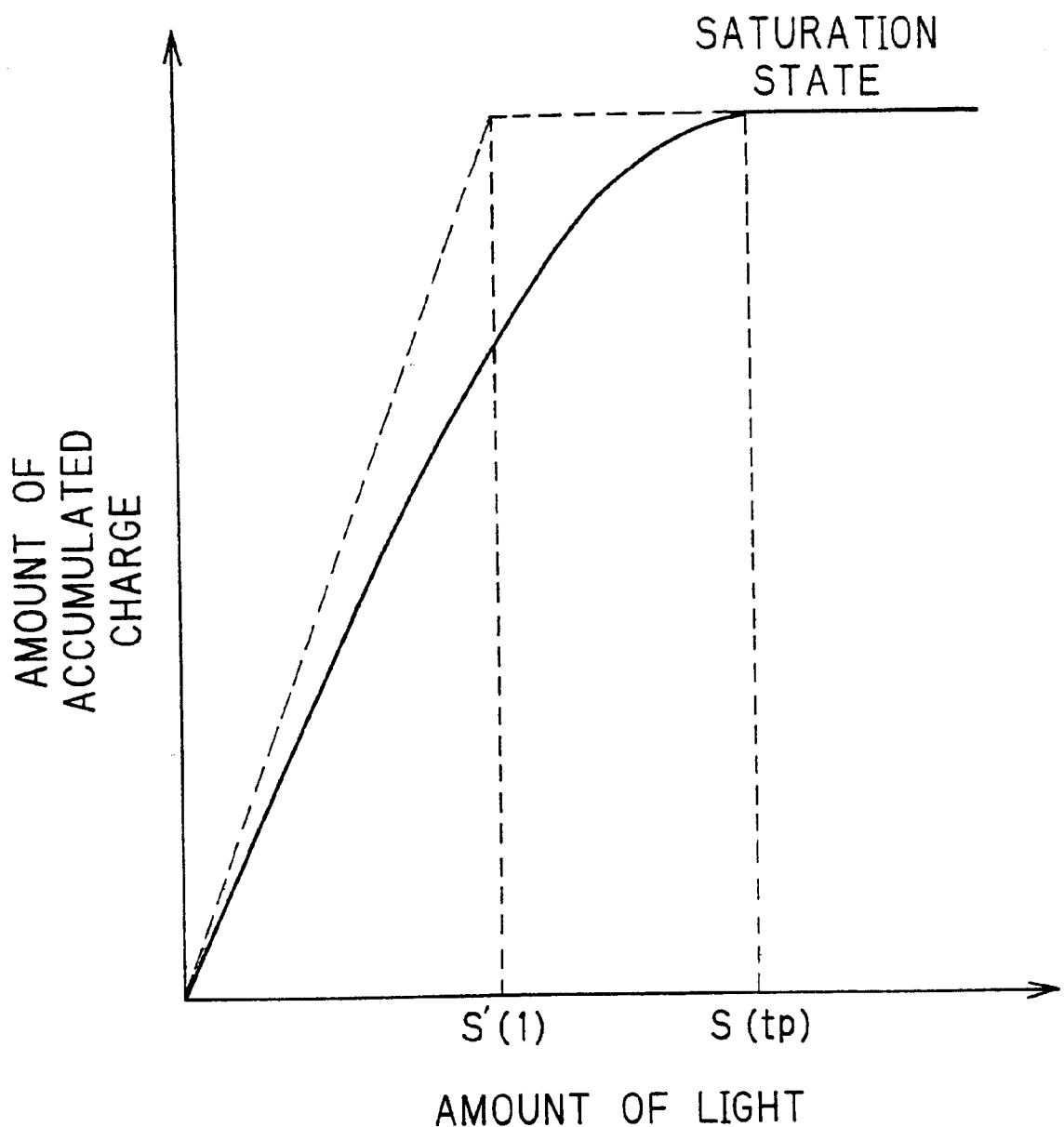

SOLID-STATE IMAGE SENSING DEVICE AND METHOD OF DRIVING THE SAME

FIELD OF THE INVENTION

This invention relates to a solid-state image sensing device and a method of driving a solid-state image sensing device.

BACKGROUND OF THE INVENTION

When a solid-state image sensing device used as an image pickup device is applied to an electronic camera, it is necessary to secure a sufficiently large dynamic range. Because the dynamic range of solid-state image sensing device is significantly narrower than that of silver film.

So, Japanese patent application laid-open No. 8-9260 (1996) discloses a technique that the dynamic range is enlarged by varying a voltage of substrate within an imaging period to switch the amount of accumulable charge of a photodiode. This conventional technique is explained below.

FIG. 1 is a plan view showing cell part in, e.g. a CCD type solid-state image sensing device. The cell part is composed of a photoelectric conversion section 101, a vertical charge transfer electrode 102, a first charge transfer electrode 105 and a second charge transfer electrode 106.

FIG. 2 is a cross sectional view cut along the line I–I' in FIG. 1. As shown, the cell part is composed of an N type semiconductor substrate 107, a P⁻ type semiconductor substrate 108, an N type semiconductor substrate 109, a P⁺ type semiconductor substrate 110, a first charge transfer electrode 105 formed with first-layer polysilicon 111, a second charge transfer electrode 106 formed with second-layer polysilicon 112. aluminum film 113 serving as shade film, insulating film 114, and cover insulating film 115.

FIG. 3 is a characteristic diagram showing the electronic potential of photoelectric conversion section.

First, in order to reset unnecessary electric charge before accumulating charge into photodiode, a substrate voltage $VH_{sub}$ is applied to the N⁻ type semiconductor substrate 107, depleting completely the N type semiconductor substrate 109 composing the photoelectric conversion section 101 and the P⁻ type semiconductor substrate 108 with a low concentration formed just hereunder, moving all the unnecessary charge to the N⁻ type semiconductor substrate 107.

Such a structure is generally called "vertical overflow drain structure (vertical OFD)" (reference: J. of Institute of Television Engineers of Japan, Vol. 37, No. 10 (1983), pp. 782–787.

Subsequently, a substrate voltage $Vb_{sub}$ (hereinafter referred to as 'substrate voltage') is applied to the N⁻ type semiconductor substrate 107, the photoelectric conversion section 101 starts accumulating a signal charge according to amount of incident light. Hereupon, by adjusting the substrate voltage arbitrarily, such excessive charge that cannot be accumulated in the photoelectric conversion section 101 is moved into the N⁻ type semiconductor substrate 107 using the vertical OFD structure, thereby the controlling of amount of accumulable charge is conducted.

Using this technique, the solid-state image sensing device is controlled so that the amount of accumulable charge in solid-state image sensing device is switched sequentially from a first amount of accumulable charge ($Q_{sat}(1)\neq0$) to a second amount of accumulable charge ($Q_{sat}(2)\neq0$, $Q_{sat}(1)<Q_{sat}(2)$) within one imaging period.

By changing the substrate voltage applied to OFD (overflow drain) of solid-state image sensing device at time t(1) within imaging period to conduct this operation, the substrate voltage is controlled so that the amount of accumulable charge in solid-state image sensing device is kept $Q_{sat}(1)$ from the beginning to time t(1) within one imaging period and, after time t(1), switched into $Q_{sat}(2)$.

FIG. 4 shows the relationship (solid line) between an amount of accumulable charge within one imaging period and charge accumulation time, in a solid-state image sensing device having such a function. FIG. 5 shows the relationship (solid line) between an amount of accumulable charge within one imaging period and an amount of light.

Dotted lines in FIGS. 4 and 5 indicate characteristics in the case that the amount of accumulable charge does not vary within one imaging period.

As shown in FIGS. 4 and 5, comparing with the case that the amount of accumulable charge does not vary, the dynamic range can be enhanced.

Namely, by providing a means for switching the amount of accumulable charge in solid-state image sensing device sequentially from the first amount of accumulable charge ($Q_{sat}(1) \neq 0$) to the second amount of accumulable charge ($Q_{sat}(2)\neq0$, $Q_{sat}(1)<Q_{sat}(2)$) within one imaging period, the dynamic range can be enhanced.

However, in the conventional solid-state image sensing device, when t(1) is set within one imaging period and $Q_{sat}(1)$ and $Q_{sat}(2)$ are set only under the condition of $Q_{sat}(1)<Q_{sat}(2)$, the dynamic range may not be improved sufficiently. Also, there may occur a case chat the dynamic range is improved little more than the case that the amount of accumulable charge does not vary. The reason is as explained below.

FIGS. 6A to 6C show the relationship between charge accumulation time where t(1) varies among t(1a), t(1b) and t(1c) and the amount of accumulable charge. FIGS. 7A to 7C show the relationship between an amount of incident light and the amount of accumulable charge. Meanwhile, t(1a)<t(1b)<t(1c) is satisfied, t(1b) is the middle point of one imaging period, and $2Q_{sat}(1)=Q_{sat}(2)$ is satisfied. Dotted lines indicate characteristics in the case that the maximum amount of accumulable charge is constant.

As seen from FIGS. 6A to 6C and 7A to 7C, in case of t(1c). the dynamic range is enhanced comparing with the case that the maximum amount of accumulable charge is constant. However, in case of t(1a) and t(1b), the dynamic range is not enhanced comparing with the case that the maximum amount of accumulable charge is constant.

This is because t(1), $Q_{sat}(1)$ and $Q_{sat}(2)$ are determined only under the condition of $Q_{sat}(1)$ $Q_{sat}(2)$. At this condition, the dynamic range cannot be improved surely comparing with the case that the amount of accumulable charge is constant. Further, the circuit is complicated comparing with the case that the amount of accumulable charge is constant.

Japanese patent application laid-open No. 1-253960 (1989) discloses a solid-state image sensing device where the saturation amount of signal transfer is made larger than the amount of signal charge in saturation of light-receiving element. However, it does not describe about that the amount of accumulable charge is varied in the form of multiple stages within one imaging period.

Also, Japanese patent application laid-open No. 5-22728 (1993) discloses a technique that the amount of accumulable charge is varied according to the gain of amplification circuit corresponding to solid-state image sensing device and the gain of white-balance adjustment circuit. However, it does not describe about that the amount of accumulable charge is varied in the form of multiple stages within one imaging period.

Further, Japanese patent application laid-open No. 10-150183 (1998) discloses a solid-state image sensing device equipped with a drive system that reduces an OFD bias to solid-state image sensing element when reading an amount of charge. However, it does not describe about that the amount of accumulable charge is varied in the form of multiple stages within one imaging period.

SUMMARY OF THE INVENTION

Accordingly, it is an object of the invention to provide a solid-state image sensing device and a method of driving a solid-state image sensing device that the dynamic range is improved effectively.

It is an object of the invention to provide a solid-state image sensing device and a method of driving a solid-state image sensing device that even when the photoelectric conversion efficiency is varied with amount of light, an image that does not give uncomfortable feeling to eyes can be produced.

According to the invention, a solid-state image sensing device, comprises:
- a plurality of sensing means arrayed in the form of a matrix;
- a charge accumulation means that is connected to the sensing means and accumulates a charge generated at the sensing means;
- an accumulable charge adjusting means that adjusts the amount of accumulable charge of the charge accumulation means; and
- a control means that controls the accumulable charge adjusting means;
- wherein the control means controls the amount of accumulable charge to vary continuously or discontinuously in time series within one imaging period and within a given amount of accumulable charge of the control means.

According to another aspect of the invention, a method of driving a solid-state image sensing device which comprises a plurality of sensing means arrayed in the form of a matrix,
- a charge accumulation means that is connected to the sensing means and accumulates a charge generated at the sensing means, an accumulable charge adjusting means that adjusts the amount of accumulable charge of the charge accumulation means, and a control means that controls the accumulable charge adjusting means, comprising the step of:
- controlling the amount of accumulable charge to vary continuously or discontinuously in time series within one imaging period and within a given amount of accumulable charge of the sensing means, by the control means.

According to another aspect of the invention, a recording medium that stores a program to make a computer conduct a method of driving a solid-state image sensing device which comprises a plurality of sensing means arrayed in the form of a matrix, a charge accumulation means that is connected to the sensing means and accumulates a charge generated at the sensing means, an accumulable charge adjusting means that adjusts the amount of accumulable charge of the charge accumulation means, and a control means that controls the accumulable charge adjusting means, comprising the step of:
- controlling the amount of accumulable charge to vary continuously or discontinuously in time series within one imaging period and within a given amount of accumulable charge of the sensing means, by the control means.

BRIEF DESCRIPTION OF THE DRAWINGS

The invention will be explained in more detail in conjunction with the appended drawings, wherein:

FIG. 17 is characteristic diagrams showing the relationship among substrate voltage, accumulation time, amount of accumulable charge and amount of actually accumulated charge in a method of driving a solid-state image sensing device in a fifth preferred embodiment according to the invention, FIG. 18 is characteristic diagrams showing the relationship between amount of actually accumulated charge and amount of light in the fifth embodiment.

DESCRIPTION OF THE PREFERRED EMBODIMENTS

Figure 1:
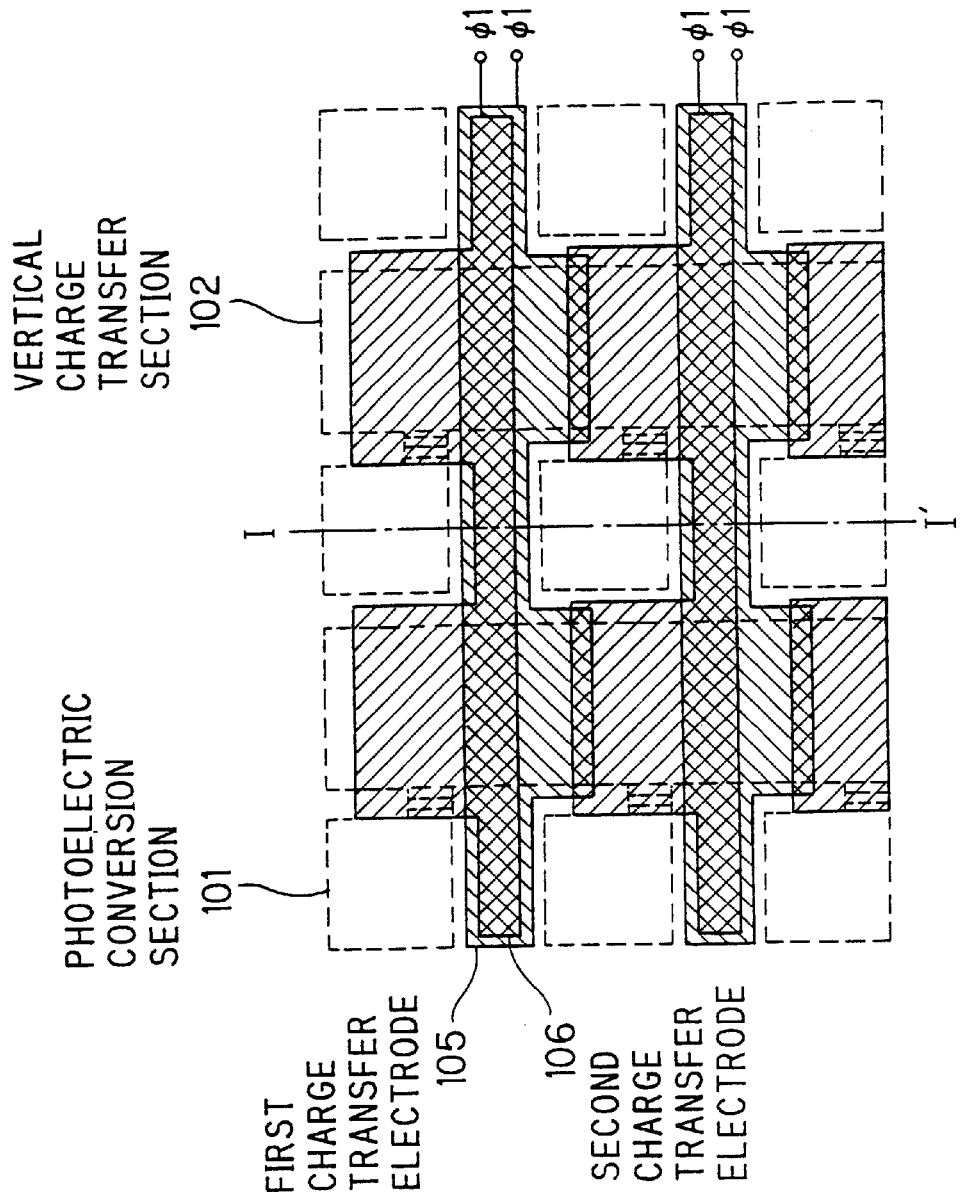
FIG. 1 is a plan view showing the photoelectric conversion section of the conventional solid-state image sensing device.
Figure 2:
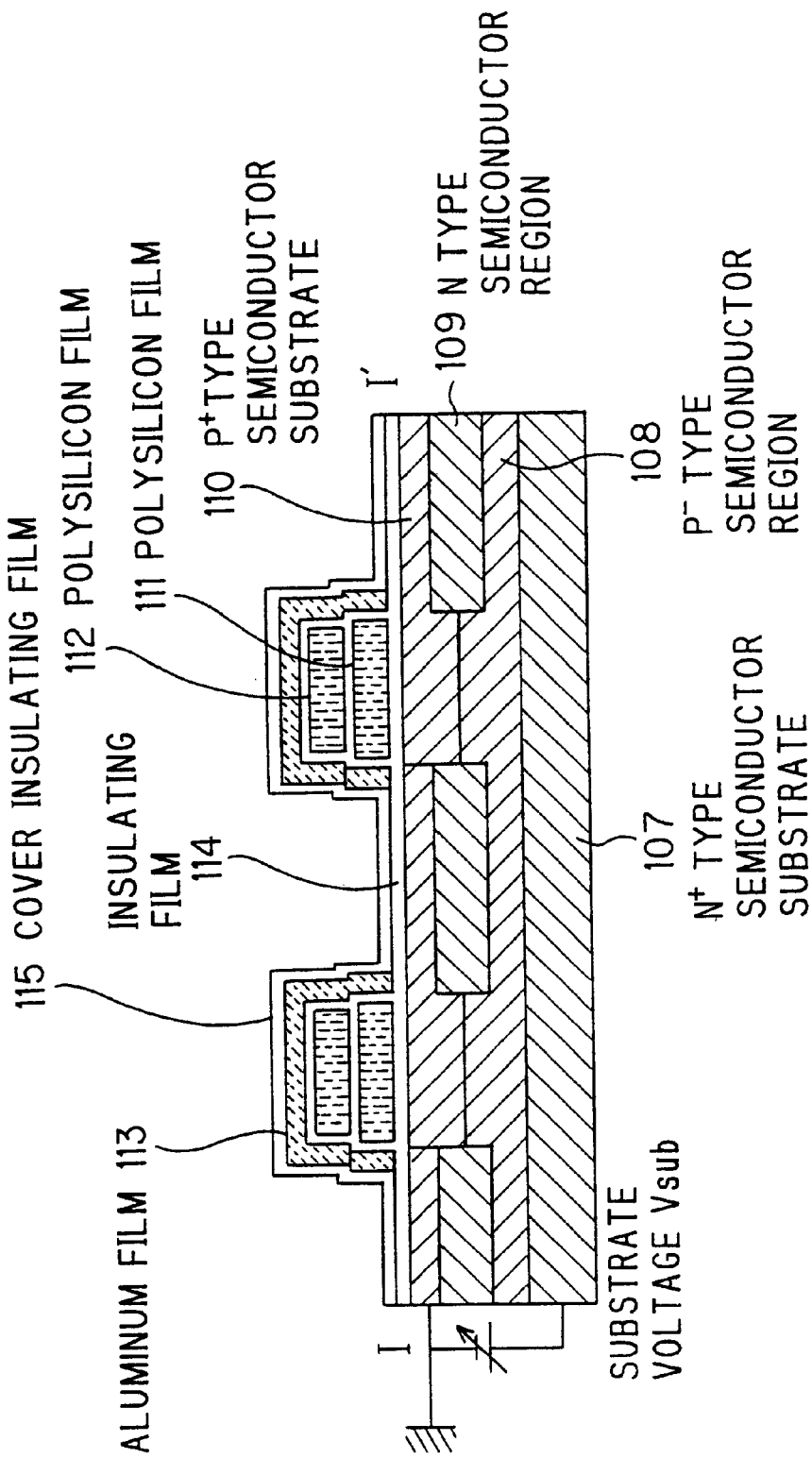
FIG. 2 is a cross sectional view cut along the line I–I' in FIG. 1.
Figure 3:
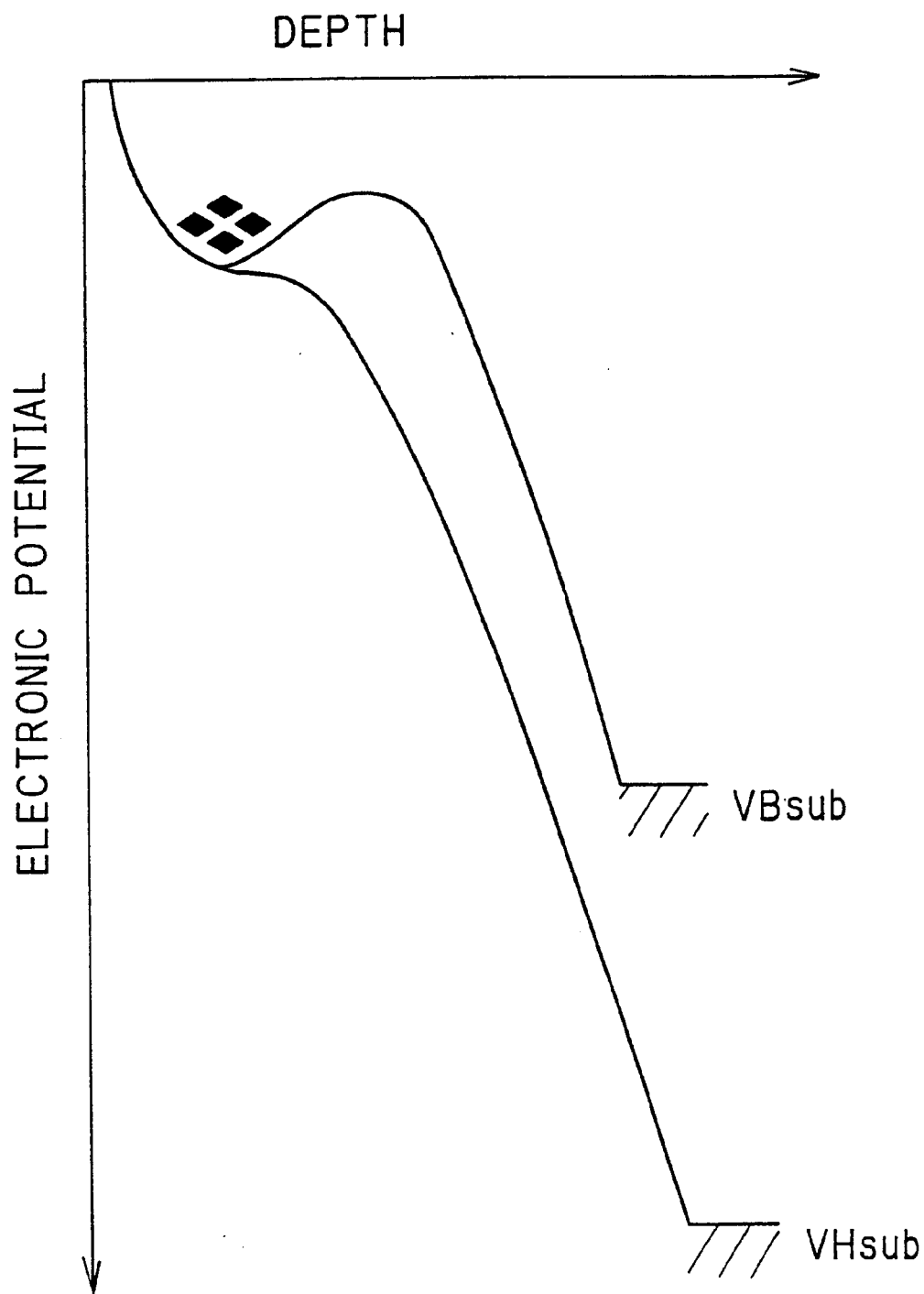
FIG. 3 is a potential diagram of a conventional photoelectric conversion section with a vertical OFD structure.
Figure 4:
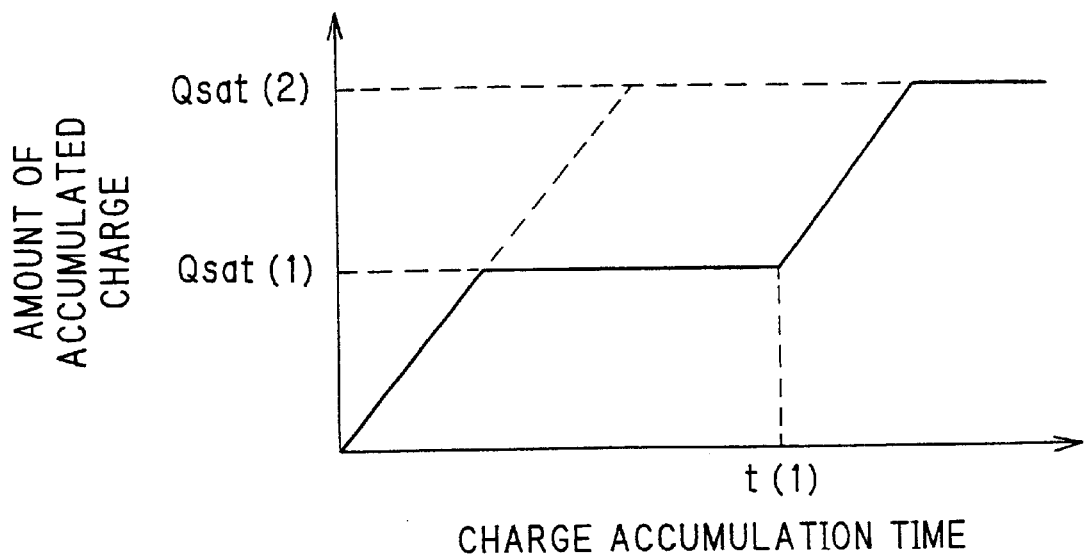
FIG. 4 is a characteristic diagram showing the relationship between amount of accumulable charge and charge accumulation time in the conventional device.
Figure 5:
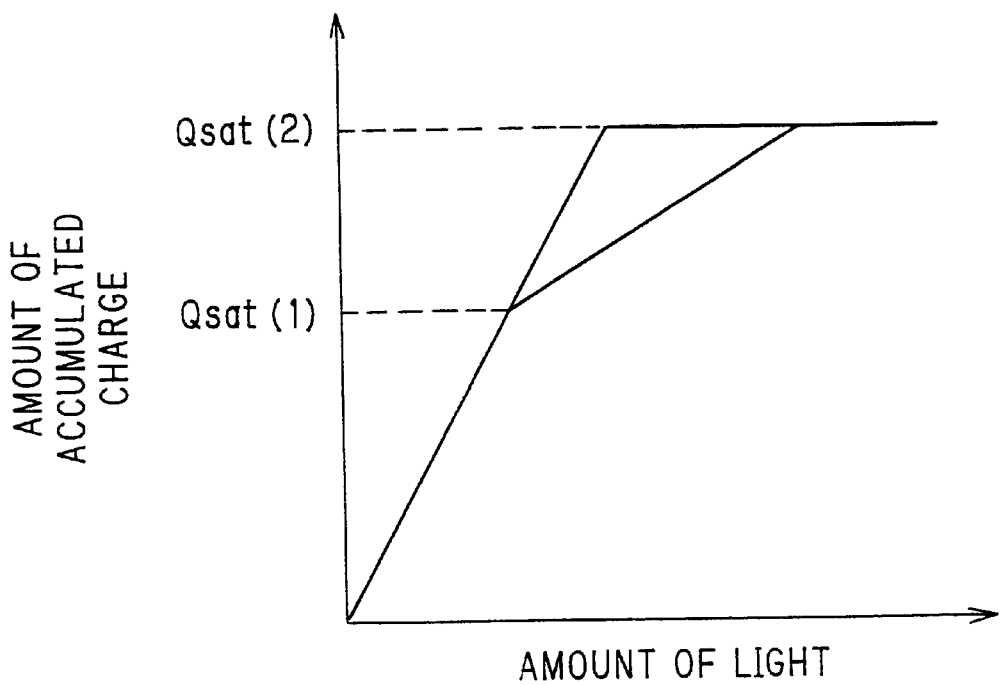
FIG. 5 is a characteristic diagram showing the relationship between amount of accumulable charge and amount of light in the conventional device.
Figure 6A:
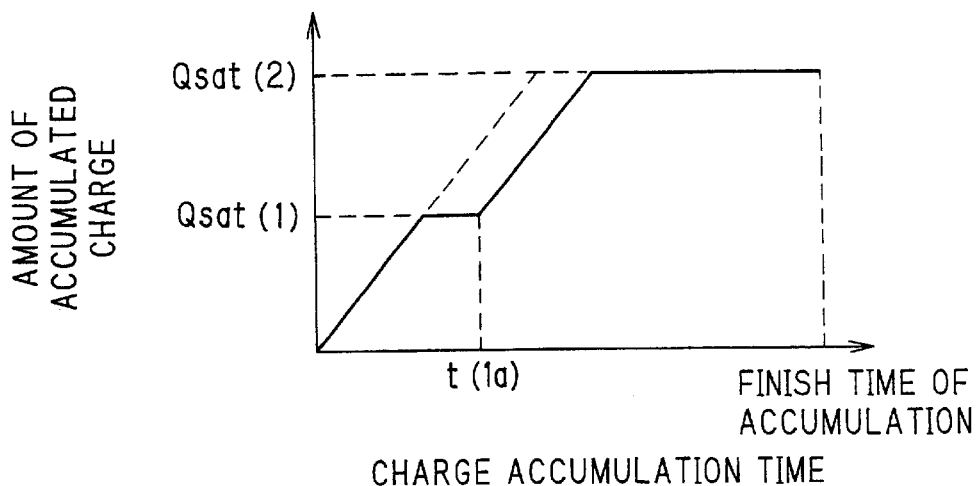
FIGS. 6A to 6c are characteristic diagrams showing the relationship between amount of accumulable charge and charge accumulation time when t(1) is varied in the conventional device.
Figure 6B:
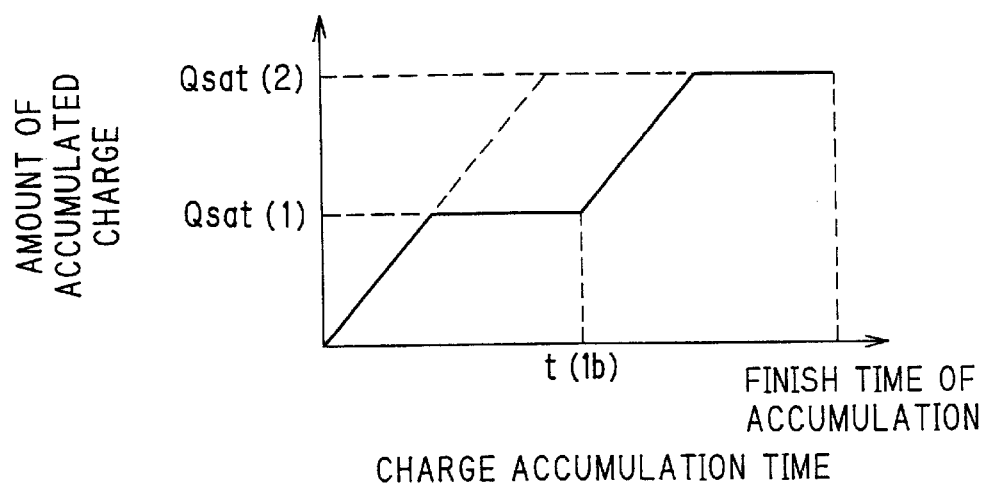
Figure 6C:
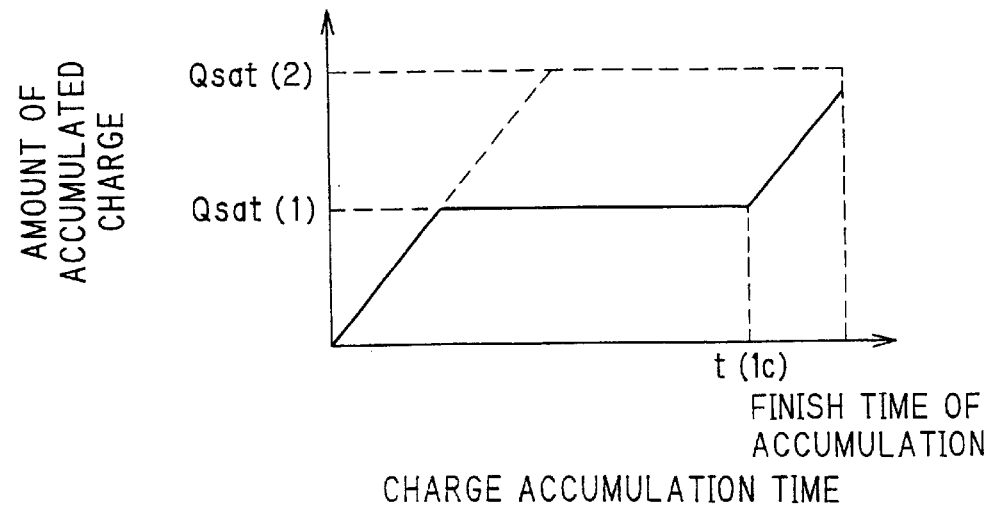
Figure 7A:
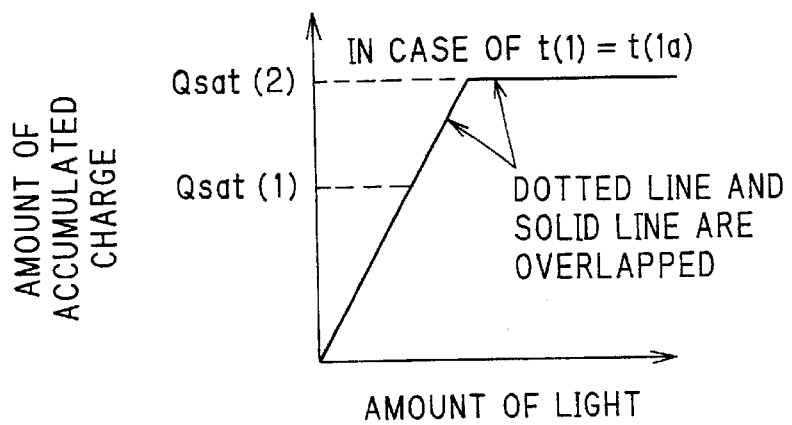
FIGS. 7A to 7c are characteristic diagrams showing the relationship between amount of accumulable charge and charge accumulation time when t(1) is varied in the conventional device.
Figure 7B:
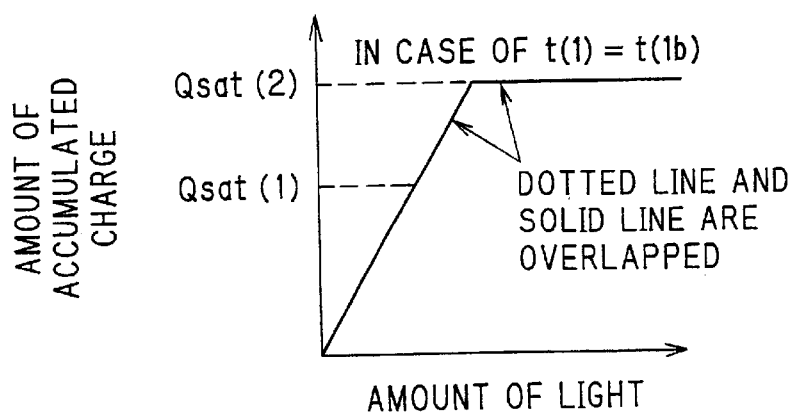
Figure 7C:
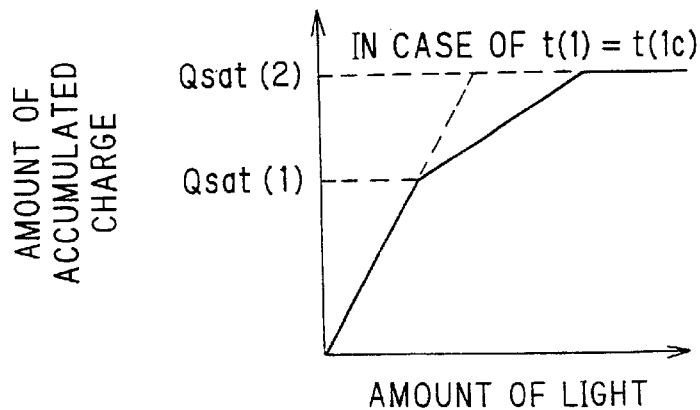

A solid-state image sensing device and a method of driving a solid-state image sensing device in the preferred embodiments will be explained below, referring to the drawings.

Figure 8:
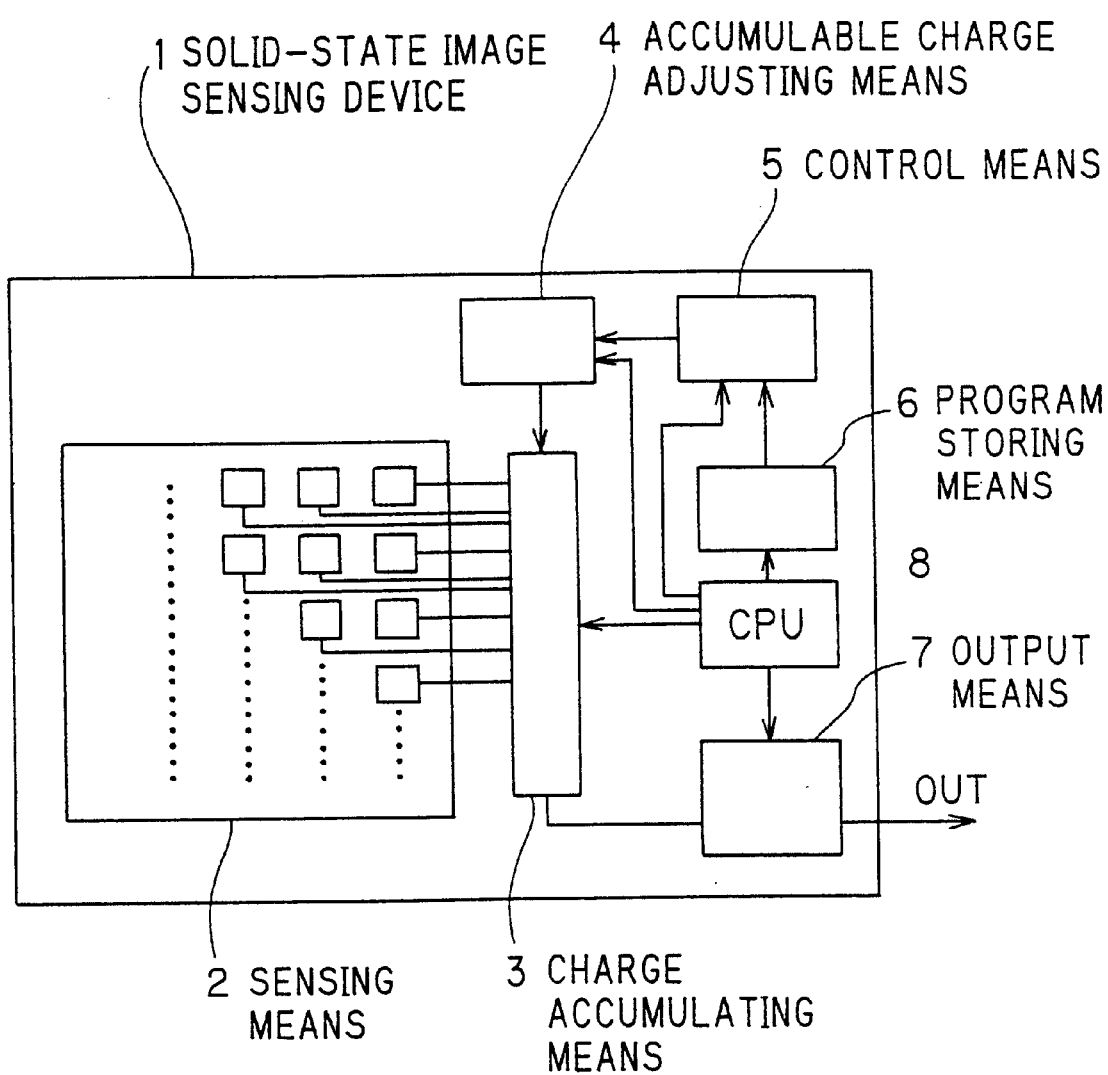
FIG. 8 is a block diagram showing a compositional example of a solid-state image sensing device according to the invention.

FIG. 8 is a block diagram showing a compositional example of a solid-state image sensing device 1 in the preferred embodiment according to the invention. As shown, the solid-state image sensing device 1 comprises multiple sensing means (sensor elements) 2 arrayed in the form of a matrix, a charge accumulation means 3 that is connected to the sensing means 2 and accumulates a charge generated at the sensing means 2, an accumulable charge adjusting means 4 to adjust the amount of accumulable charge of the charge accumulation means 3, and a control means 5 to control the accumulable charge adjusting means 4. The control means 5 is composed so that it controls the amount of accumulable charge to vary continuously or discontinuously in time series within one imaging period and within a given amount of accumulable charge.

For the solid-state image sensing device 1 according to the invention, it is desirable that the sensing means 2 is one selected from a CMOS sensing means and a vertical overflow drain type sensing means.

Also, in this invention, it is desirable that the amount of accumulable charge of the solid-state image sensing device can be controlled to increase gradually in time series.

Further, in this invention, it is desirable that the control means 5 is composed so that it controls, e.g., the substrate voltage of the sensing means 2 or the gate voltage of a transistor composing the charge extracting means of the sensing means 2 to vary when varying the amount of accumulable charge.

For the solid-state image sensing device according to the invention, it is desirable that, as shown in FIG. 8, the control means 5 is connected to a program storing means 6 which stores some control applications described later, and a control program selected arbitrarily from the program storing means 6 controls the control means 5.

Also, in the solid-state image sensing device according to the invention, a charge accumulated at the charge accumulation means 3 is output, through an output means 7 provided separately, from the respective charge accumulation means 3 corresponding to the sensing means 2 at a proper timing.

In FIG.8, 8 is a central processing unit (CPU) that controls totally the respective components of the solid-state image sensing device 1.

Next, methods of driving the solid-state image sensing device 1 thus composed in the preferred embodiments are explained referring to the drawings.

Basically, a method of driving the solid-state image sensing device 1, which comprises the multiple sensing means (sensor elements) 2 arrayed in the form of a matrix, the charge accumulation means 3 that is connected to the sensing means 2 and accumulates a charge generated at the sensing means 2, the accumulable charge adjusting means 4 to adjust the amount of accumulable charge of the charge accumulation means 3, and the control means 5 to control the accumulable charge adjusting means 4, comprising the step of controlling the amount of accumulable charge to vary continuously or discontinuously in time series within one imaging period and within a given amount of accumulable charge, by the control means 5.

In the preferred embodiments of the invention, the amount of accumulable charge is controlled to increase gradually in time series within one imaging period.

Although the way of varying the amount of accumulable charge is not limited specifically in this invention, it is desirable that either or both of a timing for varying the amount of accumulable charge and a degree of amount of accumulable charge to be varied within one imaging period are controlled.

The specific ways of varying the amount of accumulable charge in the charge accumulation means 3 are explained below.

A method of driving the solid-state image sensing device in the first preferred embodiment according to the invention is composed of the step of conducting the switching operation of amount $Q_{sat}(n)$ of accumulable charge in the order of $Q_{sat}(1)$ and $Q_{sat}(2)$ within one imaging period in the solid-state image sensing device 1 that can control the amount of accumulable charge while controlling the accumulation modes of $Q_{sat}(1)$ and $Q_{sat}(2)$ to satisfy:

$$Q_{sat}(1)/t(1) < (Q_{sat}(1) - Q_{sat}(2))/(t(2) - t(1))$$

where the finish time of accumulation mode of $Q_{sat}(1)$ is $t(1)$ and the finish time of accumulation mode of $Q_{sat}(2)$ corresponding to the end of one imaging period T1 is $t(2)$.

Figure 9:
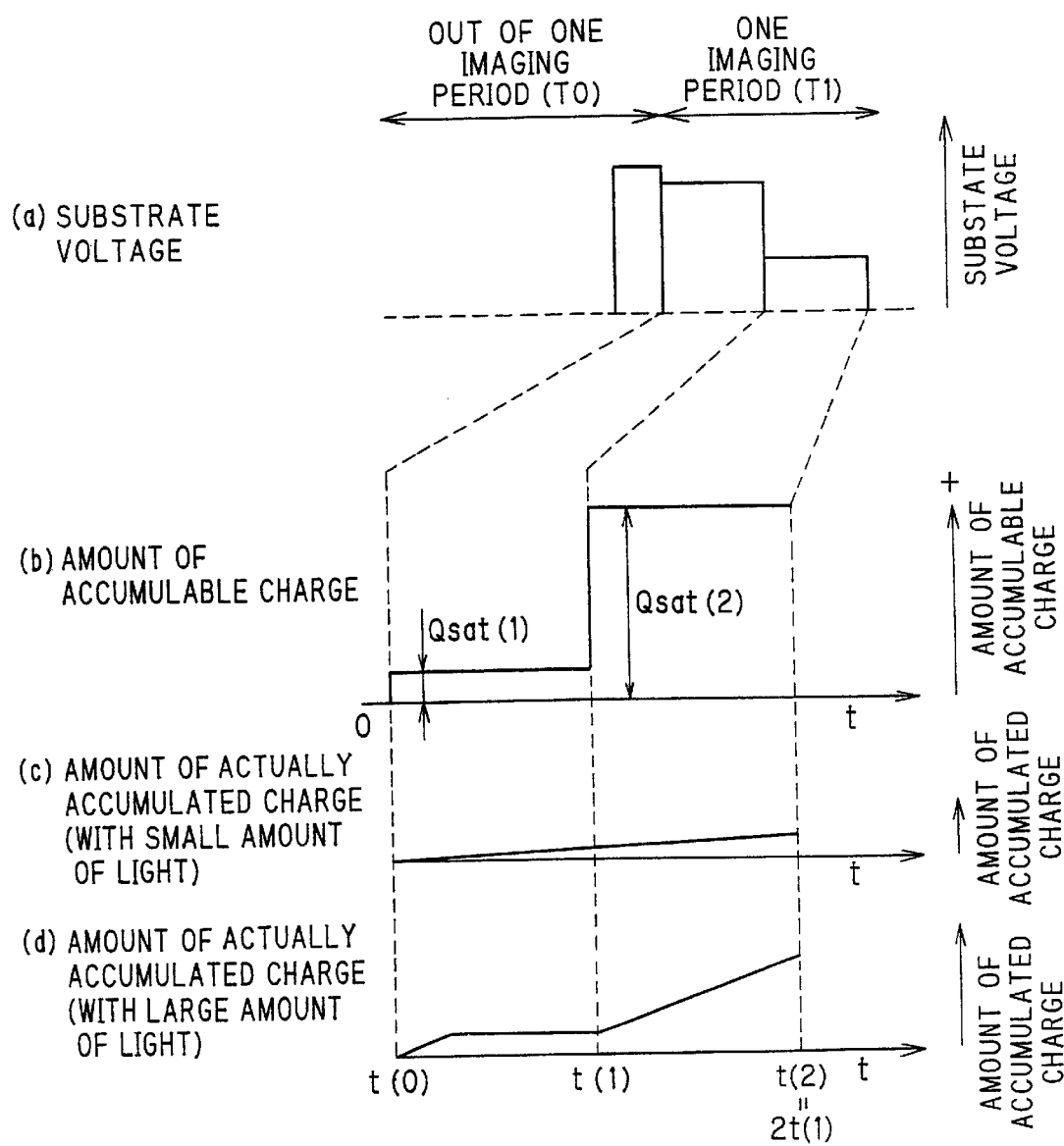
FIG. 9 is characteristic diagrams showing the relationship among substrate voltage, accumulation time, amount of accumulable charge and amount of actually accumulated charge in a method of driving a solid-state image sensing device in a first preferred embodiment according to the invention.

In detail, in this embodiment, as shown in FIG. 9, the amount $Q_{sat}(n)$ of accumulable charge is controlled to vary in the form of two stages within one imaging period T1. In FIG. 9, the substrate voltage, the amount of accumulable charge and the amount $Q_{sat}(n)$ of charge actually accumulated into photodiode are shown.

FIG. 9(a) shows the substrate voltage within one imaging period T1.

Namely, at period T0 out of the accumulation time, a shutter voltage as stationary or pulse signal is applied, thereby a charge photoelectric-converted by photodiode is swept out into the substrate.

At accumulation time $t(0)$, a substrate voltage lower than the shutter voltage and higher than a blooming suppression voltage is applied, thereby $Q_{sat}(1)$ is determined.

Then, at accumulation time $t(1)$, the substrate voltage lowers, thereby $Q_{sat}(2)$ with a larger amount of accumulable charge than $Q_{sat}(1)$ is determined.

Meanwhile, in this embodiment, $t(1)$ is the middle point of one imaging period, and satisfies the relation of $2 \times t(1) = t(2)$ with $t(2)$ that is the finish time of the accumulation mode of $Q_{sat}(2)$ and is the end of one imaging period.

Further, the substrate voltage is set to satisfy the relation of $2 \times Q_{sat}(1) < Q_{sat}(2)$.

Thus, the condition of $Q_{sat}(1)/t(1) < (Q_{sat}(2) Q_{sat}(1))/t(^2) - t(1))$ is satisfied.

FIG. 9 (b) shows the amount of accumulable charge within one imaging period T1.

Since the substrate voltage is defined as shown in FIG. 9(a), $Q_{sat}(2)$ is an amount of accumulable charge more than twice $Q_{sat}(1)$.

FIGS. 9(c) and (d) show an amount of charge accumulated into photodiode when a large amount of light and a small amount of light are supplied. FIG. 9(c) shows the case that a small amount of light is supplied, and shows a condition that electric charge is accumulated into photodiode without overflowing within one imaging period.

On the other hand, FIG. 9(d) shows the case that a large amount of light is supplied. In the time zone for the mode of $Q_{sat}(1)$, a saturated period occurs temporarily. But, in the time for the mode of $Q_{sat}(2)$, even until time t(2) when the mode of $Q_{sat}(2)$ finishes, charge photoelectric-converted is accumulated into photodiode without saturating.

The big difference from the conventional device is that, even for amount of light incurring the saturation in the time zone for the mode of $Q_{sat}(^1)$ a region with an amount of light not saturated certainly exists in the mode of $Q_{sat}(2)$.

Figure 10:
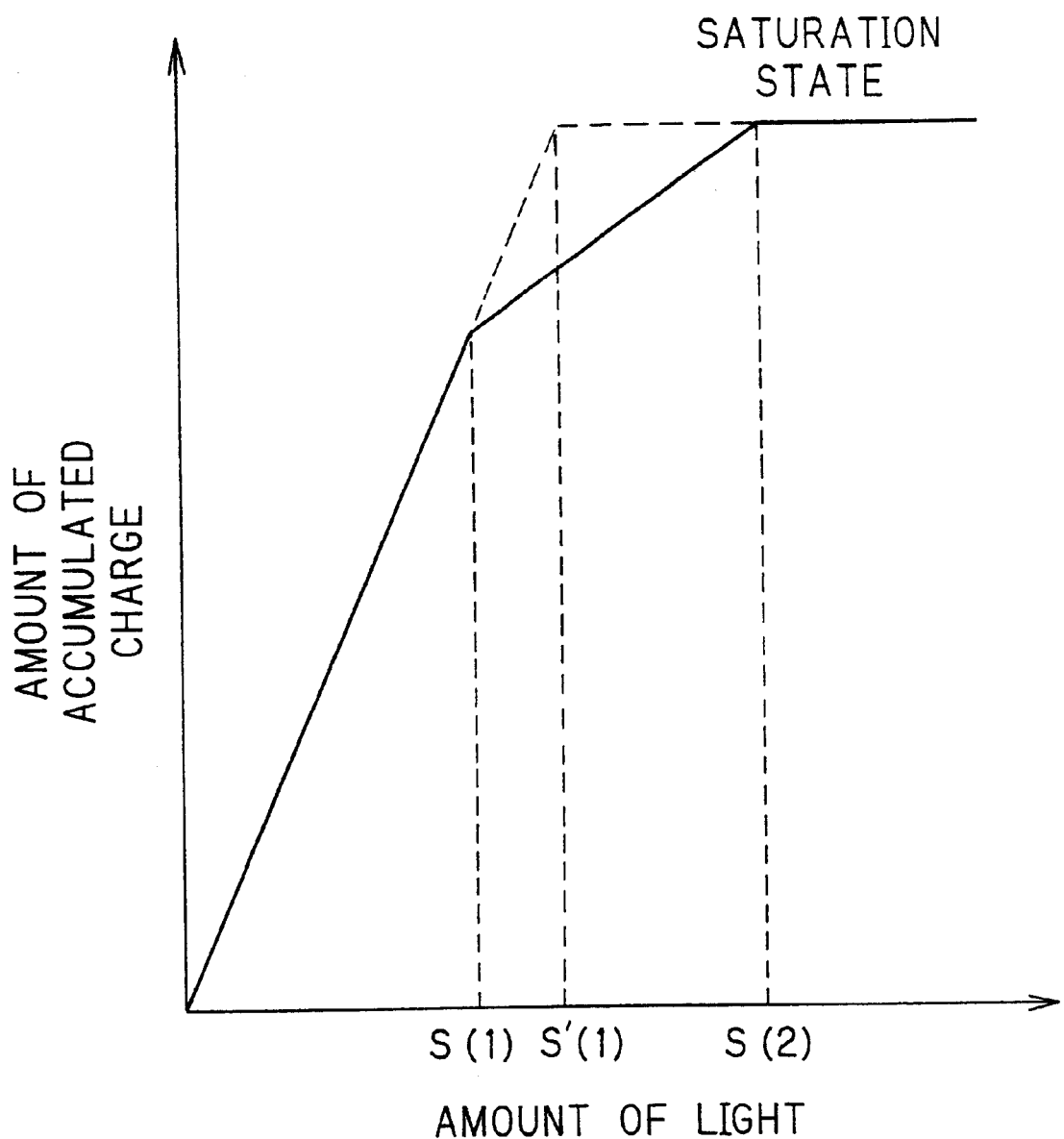
FIG. 10 is characteristic diagrams showing the relationship between amount of actually accumulated charge and amount of light in the first embodiment.

FIG. 10 shows the dependency of amount of charge accumulated into photodiode to amount of light. A solid line indicates the relationship between amount of light and amount of actually accumulated charge in the first embodiment of the invention, and a dotted line indicates the relationship between amount of light and amount of accumulated charge in the case that the amount of accumulable charge is constant.

Namely. S'(1) indicates a minimum amount of light where the photodiode is saturated in the case that amount $Q_{sat}(n)$ of accumulable charge is constant.

On the other hand, although for an amount of light more than s(1), the photodiode is saturated in the time zone for the mode of $Q_{sat}(1)$ for an amount of light more than S(1) and less than S(2), the photodiode is not saturated in the time zone for the mode of $Q_{sat}(2)$.

Meanwhile, for an amount of light more than S(2), the photodiode is saturated in both the time zones for the modes of $Q_{sat}(1)$ and $Q_{sat}(2)$.

Here, the relationship of S(2)>S'(1) is shown, and it is proved that according to the first embodiment, the dynamic range can be enhanced comparing with the conventional device.

Meanwhile, S(1) can be set arbitrarily within a range that S'(1)>S(1) is satisfied. However, 5(2) is determined uniquely by $Q_{sat}(1)$ and $Q_{sat}(2)$ that satisfy the condition of $2Q_{sat}(1) < Q_{sat}(2)$.

A method of driving the solid-state image sensing device in the second preferred embodiment according to the invention is explained below. In the second embodiment, the control operation is conducted like that in the first embodiment, but the conditions of the control are slightly different from those in the first embodiment.

Figure 11:
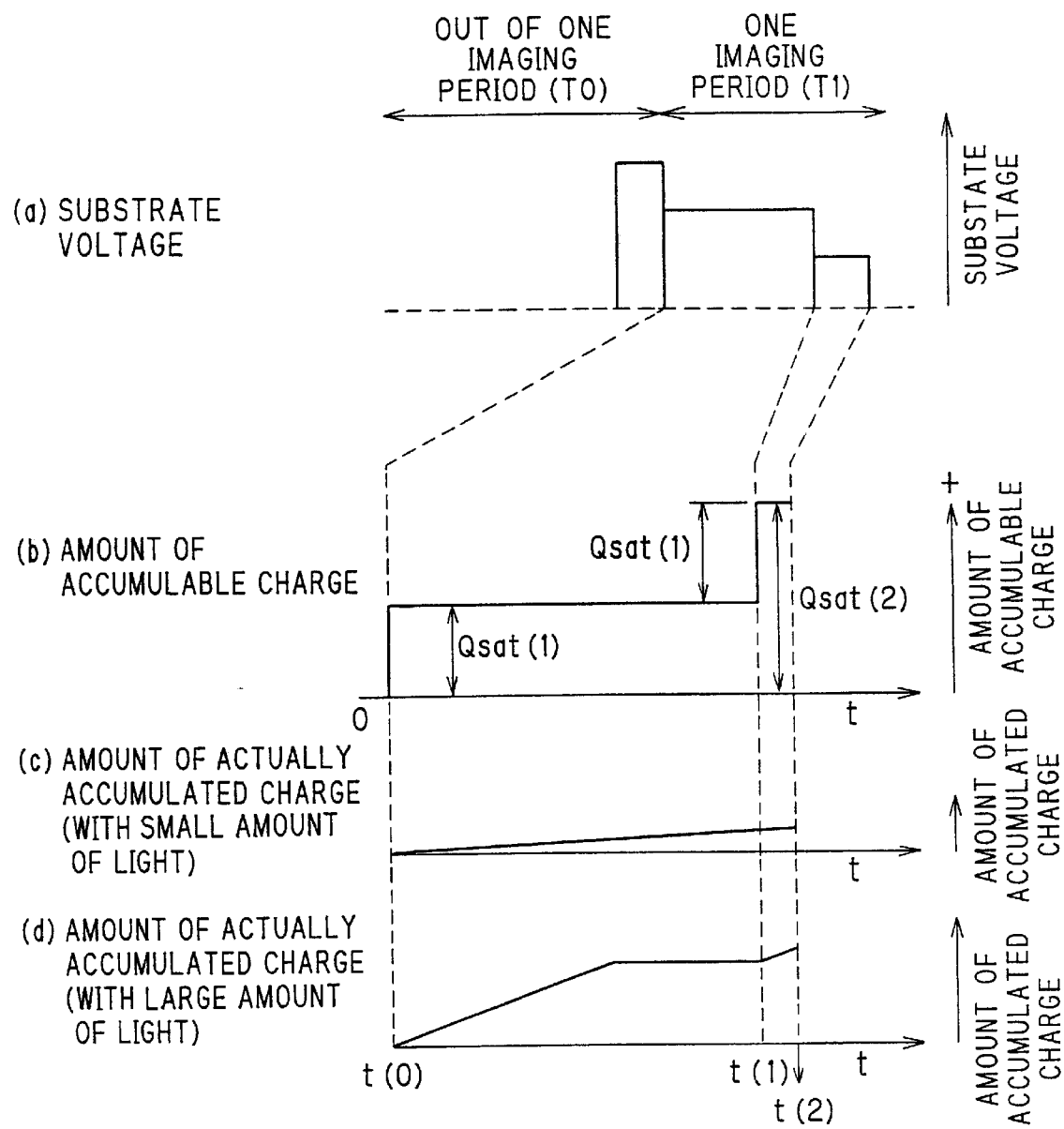
FIG. 11 is characteristic diagrams showing the relationship among substrate voltage, accumulation time, amount of accumulable charge and amount of actually accumulated charge in a method of driving a solid-state image sensing device in a second preferred embodiment according to the invention.

Namely, in this embodiment, as shown in FIG. 11, the amount of accumulable charge is controlled to vary in the form of two stages within one imaging period T1. In FIG. 11, the substrate voltage, the amount of accumulable charge and the amount of charge actually accumulated into photodiode are shown.

FIG. 11(a) shows the substrate voltage within one imaging period T1. At period T0 out of the accumulation time, a shutter voltage as stationary or pulse signal is applied as is the case in FIG. 9, thereby a charge photoelectric-converted by photodiode is swept out into the substrate.

At accumulation time t(0), a substrate voltage lower than the shutter voltage and higher than a blooming suppression voltage is applied, thereby $Q_{sat}(1)$ is determined.

Then, at accumulation time t(1), the substrate voltage lowers, thereby $Q_{sat}(2)$ with a larger amount of accumulable charge than $Q_{sat}(1)$ is determined.

Meanwhile, in this embodiment, t(1) is set at a timezone later than the middle point of one imaging period, and satisfies the relation of 2×t(1)>t(2) with t(2) that is the finish time of the accumulation mode of $Q_{sat}(2)$ and is the end of one imaging period.

Further, the substrate voltage is set to satisfy the relation of $2 \times Q_{sat}(1) = Q_{sat}(2)$.

Thus, the condition of $Q_{sat}(1)/t(1) < (Q_{sat}(2)-Q_{sat}(1))/(t(2)-t(1))$ is satisfied.

FIG. 11(b) shows the amount of accumulable charge within one imaging period T1.

Since the substrate voltage is defined as shown in FIG. 11(a), the time zone for the mode of $Q_{sat}(2)$ is shorter than that of $Q_{sat}(1)$.

FIGS. 11(c) and (d) shows an amount of charge accumulated into photodiode when a large amount of light and a small amount of light are supplied. As is the case in FIG. 9(c) FIG. 11(c) shows the case that a small amount of light is supplied, and shows a condition that electric charge is accumulated into photodiode without overflowing within one imaging period.

On the other hand, when a large amount of light is supplied (FIG. 11(d)), a saturated period occurs temporarily. But, in the time zone for the mode of $Q_{sat}(2)$, charge photoelectric-converted is accumulated into photodiode without saturating.

Figure 12:
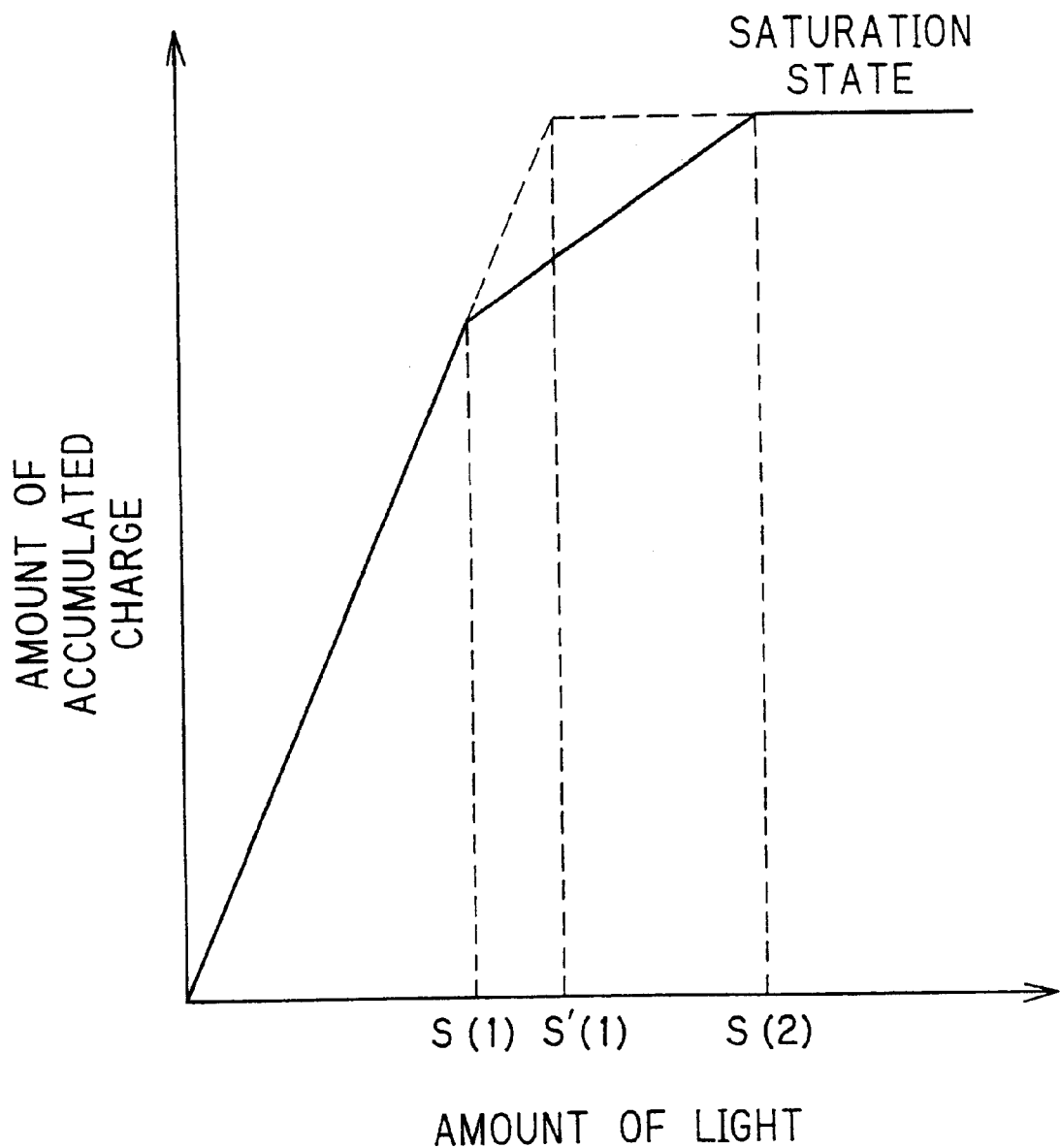
FIG. 12 is characteristic diagrams showing the relationship between amount of actually accumulated charge and amount of light in the second embodiment.

FIG. 12 shows the dependency of amount of charge accumulated into photodiode to amount of light. A solid line indicates the relationship between amount of light and amount of actually accumulated charge in the second embodiment of the invention, and a dotted line indicates the relationship between amount of light and amount of accumulated charge in the case that the amount of accumulable charge is constant.

S'(1) indicates a minimum amount of light where the photodiode is saturated in the case that amount of accumulable charge is constant.

Although for an amount of light more than s(1), the photodiode is saturated in the time zone for the mode of $Q_{sat}(1)$ for an amount of light more than S(1) and less than S(2), the photodiode is not saturated in the time zone for the mode of $Q_{sat}(2)$.

Meanwhile, for an amount of light more than S(2), the photodiode is saturated in both the time zones for the modes of $Q_{sat}(1)$ and $Q_{sat}(2)$.

Here, the relationship of S(2)>S'(1) is shown, and it is proved that according to the second embodiment, the dynamic range can be enhanced comparing with the conventional device.

Meanwhile, S(2) can be set arbitrarily, but S(1) is determined uniquely by t(1) chat satisfy the condition of 2t(1)>t(2).

A method of driving the solid-state image sensing device in the third preferred embodiment according to the invention is composed of the step of conducting the switching operation of amount $Q_{sat}(n)$ of accumulable charge in the order of $Q_{sat}(1) Q_{sat}(2), \ldots, Q_{sat}(n)$ within one imaging period in the solid-state image sensing device that can control the amount of accumulable charge, and switching sequentially from the first amount of accumulable charge ($Q_{sat}(1) \neq 0$) to the $n_{th}$ amount of accumulable charge ($Q_{sat}(1) < Q_{sat}(2) < \ldots < Q_{sat}(n)$).

Figure 13:
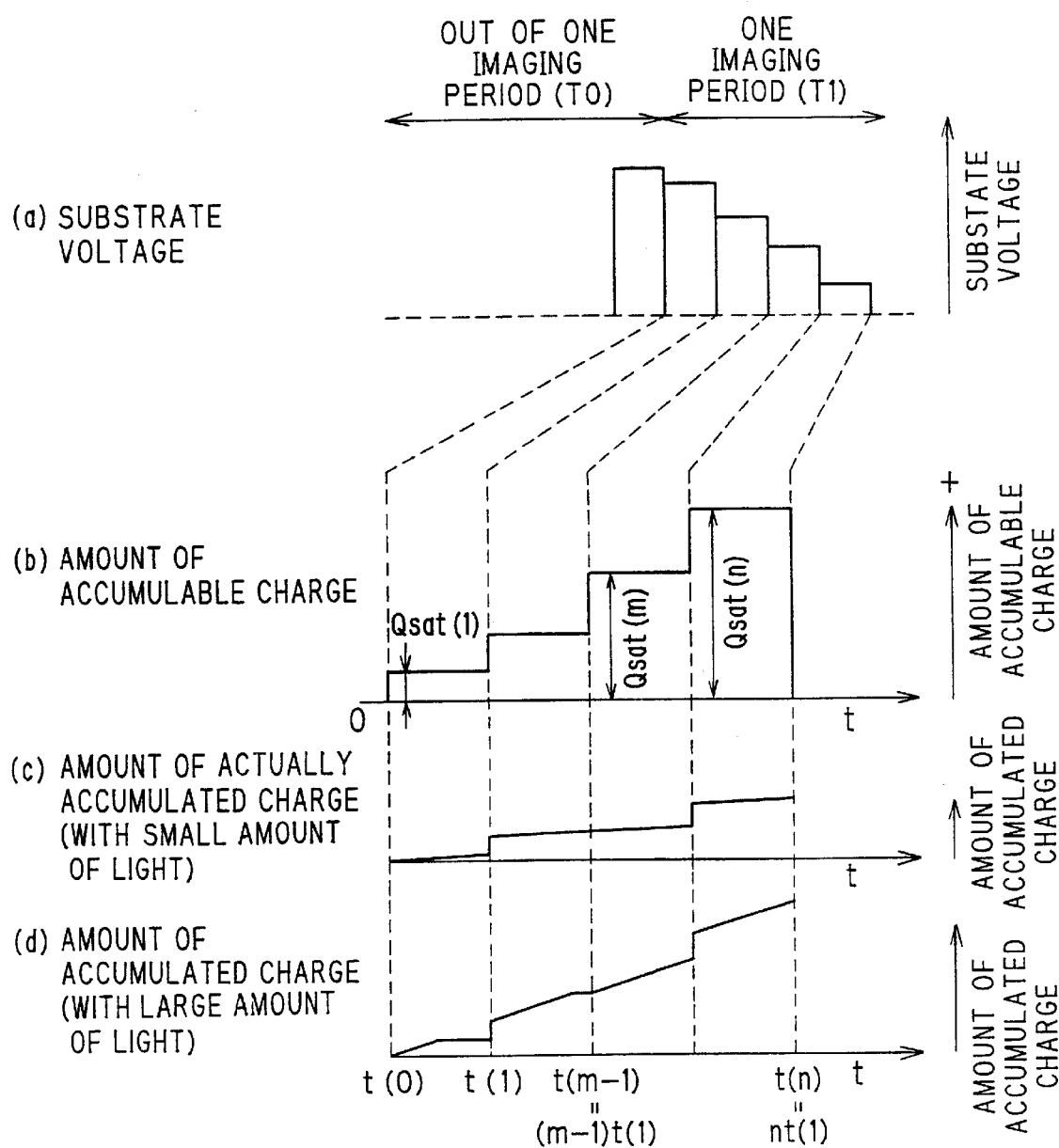
FIG. 13 is characteristic diagrams showing the relationship among substrate voltage, accumulation time, amount of accumulable charge and amount of actually accumulated charge in a method of driving a solid-state image sensing device in a third preferred embodiment according to the invention.

In detail, in this embodiment, as shown in FIG. 13, the amount of accumulable charge is controlled to vary in the form of three or more stages within one imaging period T1. FIG. 13(a) to (d) shows the substrate voltage for realizing such a control, the amount of accumulable charge and the amount of charge actually accumulated into photodiode.

FIG. 13(a) shows the substrate voltage within one imaging period T1. At accumulation time t(0), a substrate voltage lower than a shutter voltage and higher than a blooming suppression voltage is applied, thereby $Q_{sat}(1)$ is determined.

Then, when the accumulation time shifts from the start time t(0) to t(1), the substrate voltage lowers, thereby $Q_{sat}(2)$ with a larger amount of accumulable charge than $Q_{sat}(1)$ is determined. Thus, when it reaches accumulation time t(m−1) (2≦m≦n), the substrate voltage lowers. thereby $Q_{sat}(m)$ with a larger amount of accumulable charge than $Q_{sat}(m-1)$ is determined, In this embodiment, within one imaging period, t(1)=t(2)−t(1)= ... =t(m)−t(m−1)= ... (n)−t(n−1) is obtained. The substrate voltage is determined so as to satisfy the relation of $Q_{sat}(m)-Q_{sat}(m-1)<Q_{sat}(m+1)-Q_{sat}(m)$ for any integer m.

Thus, for any integer m, the relation of $Q_{sat}(m)-Q_{sat}(m-1)/t(m)-t(m-1)<Q_{sat}(m+1)-Q_{sat}(m)/t(m+1)-t(m)$ is satisfied.

FIG. 13(b) shows the amount of accumulable charge within one imaging period T1.

In this embodiment, since the substrate voltage is defined as shown in FIG. 13(a), for an arbitrary integer m (2≦m≦n), the relationship of $Q_{sat}(m)-Q_{sat}(m-1)<Q_{sat}(m+1)-Q_{sat}(m)$ is kept.

FIGS. 13(c) and (d) show an amount of charge accumulated into photodiode when a large amount of light and a small amount of light are supplied. FIG. 13(c) shows the case that a small amount of light is supplied, and shows a condition that electric charge is accumulated into photodiode without overflowing within one imaging period.

On the other hand, FIG. 13(d) shows the case that a large amount of light is supplied. In the time zone for the mode of $Q_{sat}(m-1)$ or before, a saturated period occurs temporarily. But, in the time zone for the mode of $Q_{sat}(m)$ or after, even until time t(n) when the mode of $Q_{sat}(n)$ finishes, charge photoelectric-converted is accumulated into photodiode without saturating.

Figure 14:
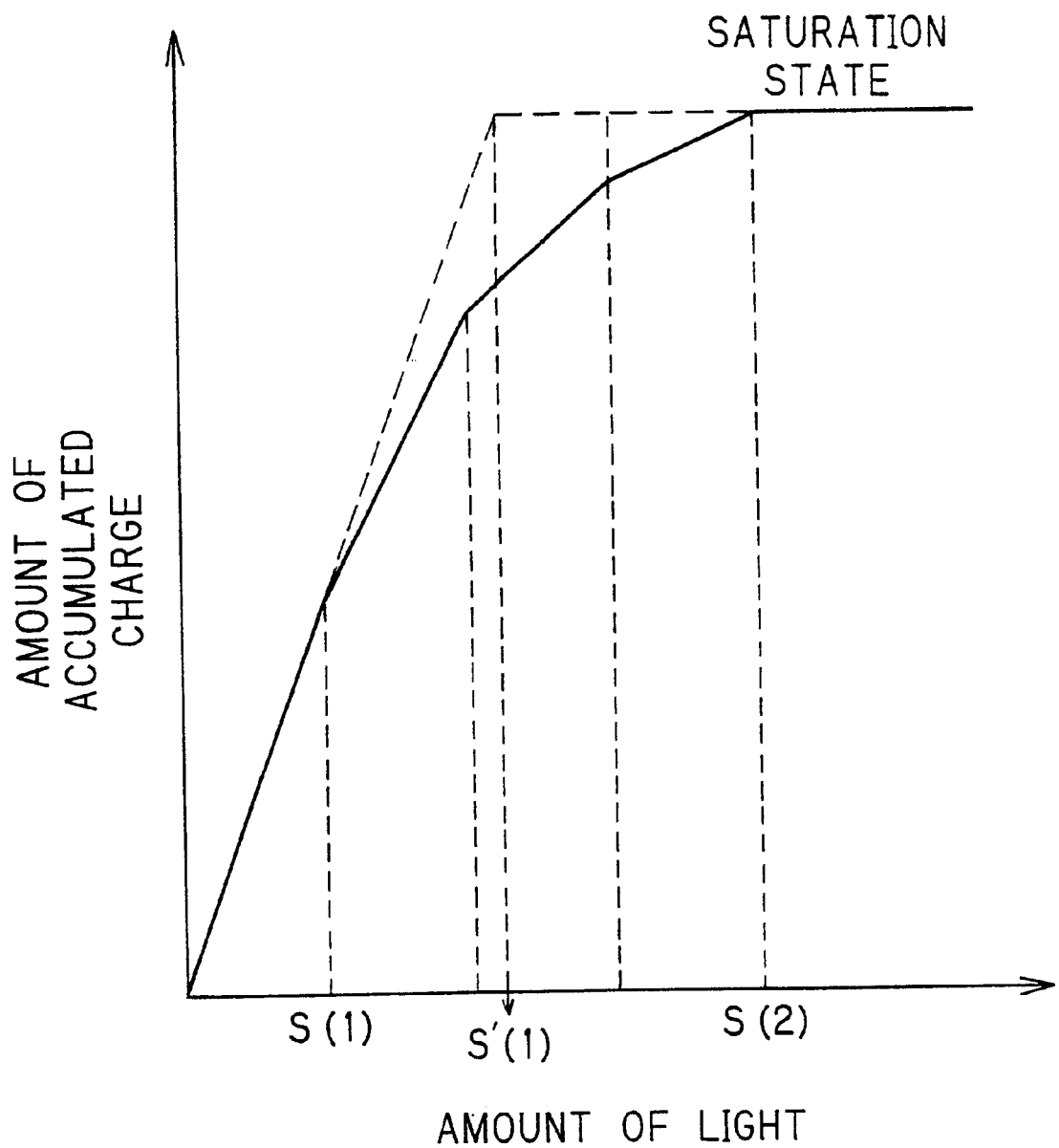
FIG. 14 is characteristic diagrams showing the relationship between amount of actually accumulated charge and amount of light in the third embodiment.

FIG. 14 shows the dependency of amount of charge accumulated into photodiode to amount of light. A solid line indicates the relationship between amount of light and amount of actually accumulated charge in the third embodiment of the invention, and a dotted line indicates the relationship between amount of light and amount of accumulated charge in the case that the amount of accumulable charge is constant.

S'(1) indicates a minimum amount of light where the photodiode is saturated in the case that amount of accumulable charge is constant.

In this embodiment, when the substrate voltage varies in the form of n stages, there are (n−1) switching points where the rate of change of amount of accumulable charge varies to amount of light, and the relation of S(1)<S(2)< ... <S(m)< ... S(n), where S(n) indicates the finish time of one imaging period, is kept.

Although for an amount of light more than S(m), the photodiode is saturated in any time zone for the mode of $Q_{sat}(1)$ to $Q_{sat}(m)$, for an amount of light more than S(m) and less than S(m+1), the photodiode is not saturated in any time zone for the mode of $Q_{sat}(m+1)$ to $Q_{sat}(n)$.

Meanwhile, for an amount of light more than S(n), the photodiode is saturated in any time zone for the mode of $Q_{sat}(1)$ and $Q_{sat}(n)$.

Meanwhile, S(1) can be set arbitrarily within a range satisfying S'(1)>S(1), but S(m)(2≦m≦n) is determined uniquely by $Q_{sat}(2)$ to $Q_{sat}(n)$ that satisfy the condition of $Q_{sat}(m)-Q_{sat}(m-1)<Q_{sat}(m+1)-Q_{sat}(m)$.

In FIG. 14, the relationship of s(2)>S'(1) is shown, and it is proved that according to the second embodiment, the dynamic range can be enhanced comparing with the conventional device.

Further, comparing with the first and second embodiments, in this embodiment, the dynamic range can be improved comparing with the case that the amount of accumulable charge is not varied, and even when the photoelectric conversion efficiency varies with the amount of light, its variation is less and can be set to be close to a continuous variation. Therefore, an image that does not give uncomfortable feeling to eyes can be produced.

Meanwhile, even when for a certain integer m, the relation of $Q_{sat}(m)-Q_{sat}(m-1)/t(m)-t(m-1)<Q_{sat}(m+1)-Q_{sat}(m)/t(m+1)-t(m)$ as defined in claim 3 is not satisfied, it is expected that the dynamic range can be improved comparing the case that the amount of accumulable charge is not varied. However, since the switching points where the rate of change of amount of accumulable charge varies to amount of light become less than (n−1), an image that gives uncomfortable feeling to eyes may be produced, different from the case that for any integer m the relation defined in claim 3 is satisfied.

A method of driving the solid-state image sensing device in the fourth preferred embodiment according to the invention is that the switching operation of amount $Q_{sat}(n)$ of accumulable charge in the third embodiment is controlled to satisfy the relation of $Q_{sat}(m)-Q_{sat}(m-1)/t(m)-t(m-1)<Q_{sat}(m+1)-Q_{sat}(m)/t(m+1)-t(m)$ for a certain integer m or any integer m that is 2 or more and less than n, where t(m) is a time from the start of accumulation to the end of the $m_{th}$-stage (2≦m≦n) accumulation mode with an amount $Q_{sat}(m)$ of accumulable charge, the finish time of one imaging period is t(n).

Figure 15:
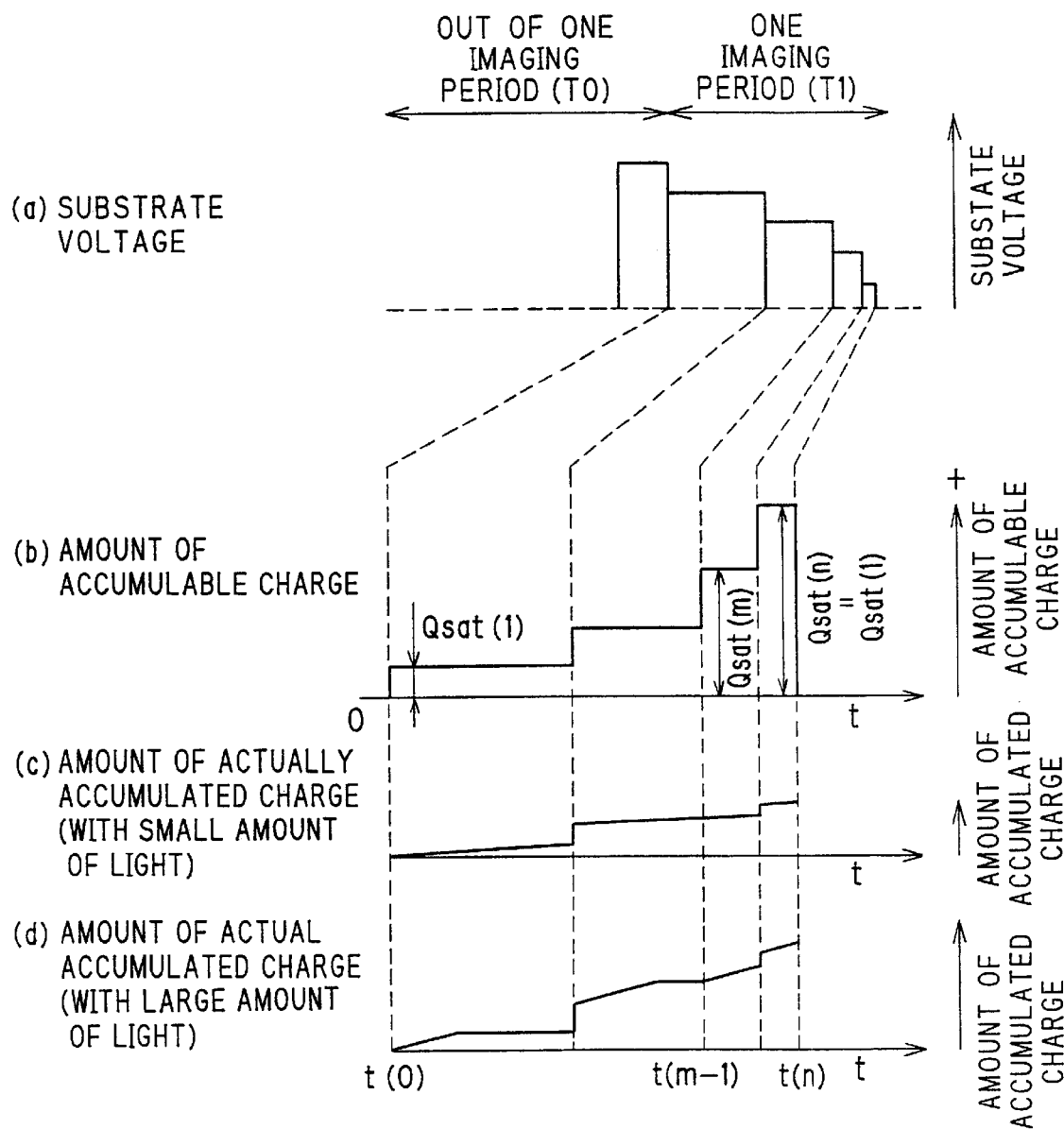
FIG. 15 is characteristic diagrams showing the relationship among substrate voltage, accumulation time, amount of accumulable charge and amount of actually accumulated charge in a method of driving a solid-state image sensing device in a fourth preferred embodiment according to the invention.

In detail, in the fourth embodiment that is basically the same as the third embodiment, as shown in FIG. 15, the amount of accumulable charge is controlled to vary in the form of three or more stages within one imaging period T1. The timing for switching the amount of accumulable charge shortens sequentially.

FIGS. 15(a) to (d) shows the substrate voltage for realizing such a control, the amount of accumulable charge and the amount of charge actually accumulated into photodiode.

FIG. 15(a) shows the substrate voltage within one imaging period T1. At accumulation time t(0), a substrate voltage lower than a shutter voltage and higher than a blooming suppression voltage is applied, thereby $Q_{sat}(1)$ is determined.

Then, when the accumulation time shifts from the start time t(0) to t(1), the substrate voltage lowers, thereby $Q_{sat}(2)$ with a larger amount of accumulable charge than $Q_{sat}(1)$ is determined.

Thus, when it reaches accumulation time t(m−1) (2≦m≦n), the substrate voltage lowers, thereby $Q_{sat}(m)$ with a larger amount of accumulable charge than $Q_{sat}(m-1)$ is determined.

In this embodiment, within one imaging period, t(1))<t(2)−t(1)> ... >t(m)−t(m−1)> ... t(n)−t(n−1) is obtained. The substrate voltage is determined so as to satisfy the relation of $Q_{sat}(m)-Q_{sat}(m-1)=Q_{sat}(m+1)-Q_{sat}(m)$ for any integer m.

Thus, for any integer m, the relation of $Q_{sat}(m)-Q_{sat}(m-1)/t(m)-t(m-1)<Q_{sat}(m+1)-Q_{sat}(m)/t(m+1)-t(m)$ is satisfied.

FIG. 15(b) shows the amount of accumulable charge within one imaging period T1.

In this embodiment, since the substrate voltage is defined as shown in FIG. 15(a), for an arbitrary integer m (2≦m≦n), the relationship of $Q_{sat}(m)-Q_{sat}(m-1)=Q_{sat}(m+1)-Q_{sat}(m)$ is kept.

FIGS. 15(c) and (d) shows an amount of charge accumulated into photodiode when a large amount of light and a small amount of light are supplied. FIG. 15(c) shows the case that a small amount of light is supplied, and shows a condition that electric charge is accumulated into photodiode without overflowing within one imaging period.

On the other hand, FIG. 15(d) shows the case that a large amount of light is supplied. In the time zone for the mode of $Q_{sat}(m-1)$ or before, a saturated period occurs temporarily. But, in the time zone for the mode of $Q_{sat}(m)$ or after, even until time t(n) when the mode of $Q_{sat}(n)$ finishes, charge photoelectric-converted is accumulated into photodiode without saturating.

Figure 16:
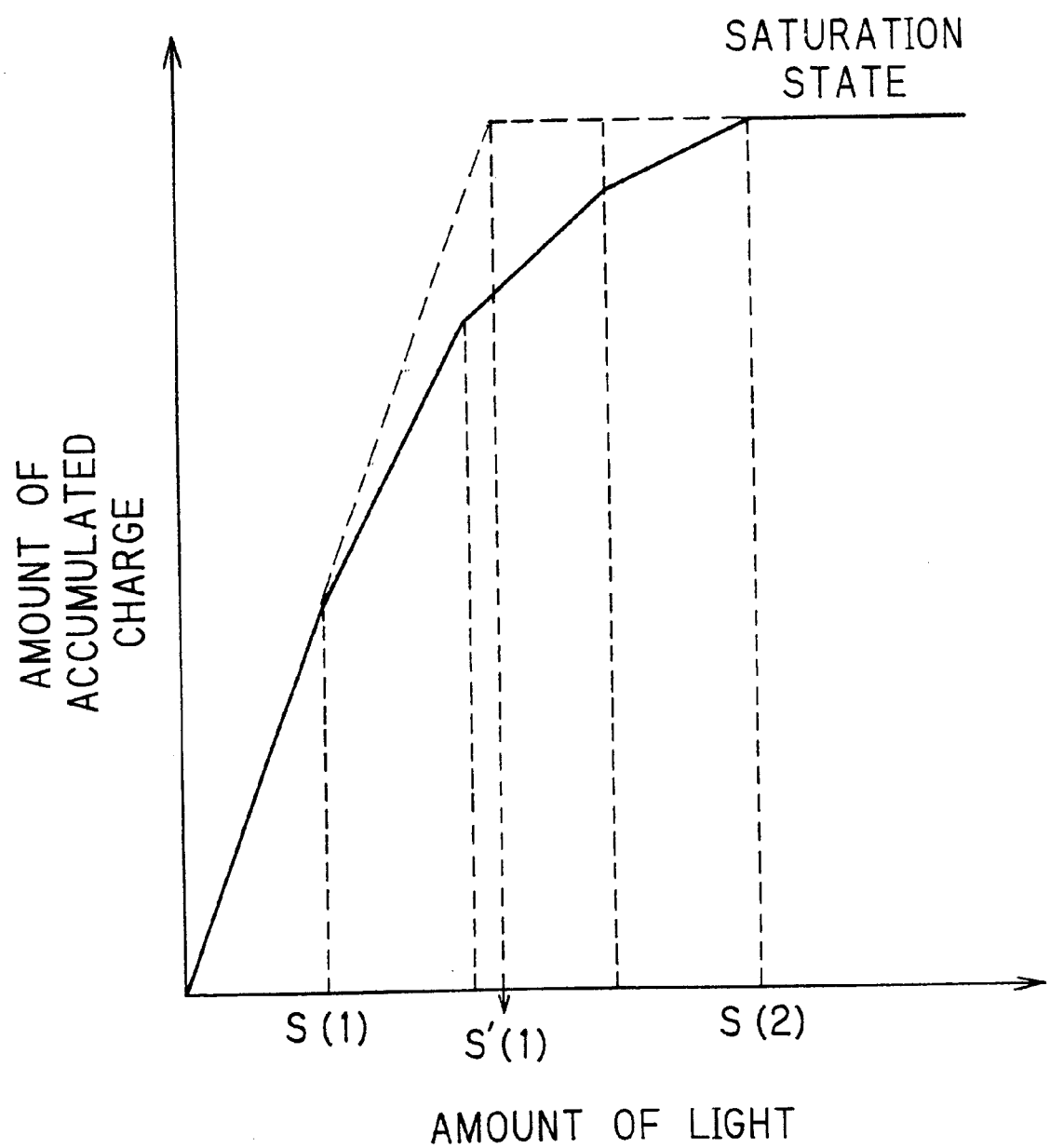
FIG. 16 is characteristic diagrams showing the relationship between amount of actually accumulated charge and amount of light in the fourth embodiment.

FIG. 16 shows the dependency of amount of charge accumulated into photodiode to amount of light. A solid line indicates the relationship between amount of light and amount of actually accumulated charge in the third embodiment of the invention, and a dotted line indicates the relationship between amount of light and amount of accumulated charge in the case that the amount of accumulable charge is constant.

S'(1) indicates a minimum amount of light where the photodiode is saturated in the case that amount of accumulable charge is constant.

In this embodiment, when the substrate voltage varies in the form of n stages, there are (n−1) switching points where the rate of change of amount of accumulable charge varies to amount of light, and the relation of s(1)<S(2)< . . . <S(m)<. . . S(n), where S(n) indicates the finish time of one imaging period, is kept.

Although for an amount of light more than S(m), the photodiode is saturated in any time zone for the mode of $Q_{sat}(1)$ to $Q_{sat}(m)$ for an amount of light more than S(m) and less than S(m+1), the photodiode is not saturated in any time zone for the mode of $Q_{sat}(m+1)$ to $Q_{sat}(n)$.

Meanwhile, for an amount of light more than S(n), the photodiode is saturated in any time zone for the mode of $Q_{sat}(1)$ and $Q_{sat}(n)$.

Meanwhile, S(1) to S(n) in FIG. 16 are made to be equal to S(1) to S(n) in FIG. 9. However, in fact, S(n) can be set arbitrarily, but S(m) (1≦m≦n−1) is determined uniquely by t(1) to t(n−1) that satisfy the condition of t(m+1)−t(m)<t(m)−t(m−1) for any m of 2≦m≦n−1.

It is proved that according to the fourth embodiment, the dynamic range can be enhanced comparing with the conventional device.

Further, comparing with the first and second embodiments, in this embodiment, the dynamic range can be improved comparing with the case that the amount of accumulable charge is not varied, and even when the photoelectric conversion efficiency varies with the amount of light, its variation is less and can be set to be close to a continuous variation. Therefore, an image that does not give uncomfortable feeling to eyes can be produced.

A method of driving the solid-state image sensing device in the fifth preferred embodiment according to the invention is explained below. In the fifth embodiment, the amount of accumulable charge in the solid-state image sensing device that can control the amount of accumulable charge is controlled to vary continuously within one imaging period, and the rate of change of amount of accumulable charge within one imaging period is controlled to satisfy $d(Q_{sat})/dt>0$.

In detail, in the fifth embodiment, the amount of accumulable charge is controlled to vary continuously within one imaging period T1.

FIGS. 17(a) to (d) shows the substrate voltage for realizing such a control, the amount of accumulable charge and the amount of charge actually accumulated into photodiode.

FIG. 17(a) shows the substrate voltage within one imaging period T1. At accumulation time, a substrate voltage lower than a shutter voltage and higher than a blooming suppression voltage is applied, thereby and the substrate voltage lowers gradually.

Hereupon, an amount $Q_{sat}(t)$ of accumulable charge at accumulation time t1 from the start of accumulation within one imaging period T1 is determined.

Also, the substrate voltage is set to satisfy $d(Q_{sat}(t))/dt>0$ and $d^2(Q_{sat}(t))/dt^2>0$ for arbitrary t, from the start of accumulation to the finish time (represented $t_p$) of one imaging period T1.

FIG. 17(b) shows the amount of accumulable charge within one imaging period T1.

In this embodiment, since the substrate voltage is defined as shown in FIG. 17(a), the amount of accumulable charge traces a continuous curve that increases in the form of convexity downward.

FIGS. 17(c) and (d) shows an amount of charge accumulated into photodiode when a large amount of light and a small amount of light are supplied. As shown, for both the small and large amount of light, electric charge is saturated until some accumulation time. However, after accumulation time $t_1$ for the small amount of light and after accumulation time $t_2$ after $t_1$ for the large amount of light, electric charge photoelectric-converted is accumulated into photodiode without being saturated until the finish time of one imaging period.

FIG. 18 shows the dependency of amount of charge accumulated into photodiode to amount of light. A solid curve indicates the relationship between amount of light and amount of actually accumulated charge in the third embodiment of the invention, and a dotted line indicates the relationship between amount of light and amount of accumulated charge in the case that the amount of accumulable charge is constant.

In this embodiment, when the substrate voltage varies continuously so as to satisfy $d(Q_{sat}(t))/dt>0$ and $d^2(Q_{sat}(t))/dt^2>0$, the amount of accumulated charge to the variation of amount of light traces a continuous curve that increases in the form of convexity upward.

Although for an amount of light more than S(m), the photodiode is saturated in time zone until some accumulation time $t_m$ ($t_m<t_n$ when S(m)<S(n)) one-to-one corresponding to this m, for an amount of light more than S(m) and less than $S(t_p)$, the photodiode is not saturated.

Meanwhile, for an amount of light more than $S(t_p)$, the photodiode is saturated always within one imaging period.

Meanwhile, $S(t_p)$ can be set arbitrarily, but the curve indicating the amount of accumulated charge corresponding to the actual variation of amount of light is determined uniquely by $Q_{Sat}(t)$ ($0≦t≦t_p$) that satisfies $d(Q_{sat}(t))/dt>0$ and $d^2(Q_{sat}(t))/dt^2>0$ for any t to satisfy $0≦t<t_p$.

It is proved that according to the fifth embodiment, the dynamic range can be enhanced comparing with the conventional device.

Further, comparing with the fourth embodiment where the amount of accumulable charge varies discontinuously, in this embodiment, even when the photoelectric conversion efficiency varies with the amount of light, its variation occurs continuously. Therefore, an image that does not give uncomfortable feeling to eyes can be produced.

As a modification of the fifth embodiment, it is desirable that in all or part of one imaging period, the amount of accumulable charge is controlled so that the secondary rate of change satisfies $d^2(Q_{sat}(t))/dt^2>0$.

Meanwhile, even when the secondary rate of change does not satisfy $d^2(Q_{sat}(t))/dt^2>0$, which is the condition of control in this embodiment, and satisfies $d^2(Q_{sat}(t))/dt^2=0$ from some accumulation time t(m) until t(n), it is expected that the dynamic range can be enhanced comparing with the case that the amount of accumulable charge is not varied. Further, even when the photoelectric conversion efficiency varies with the amount of light, its variation occurs continuously. Therefore, an image that does not give uncomfortable feeling to eyes can be produced.

However, in the period from t(m) to t(n), for some amount of light more than S(m) that one-to-one corresponds to t(m), the photodiode is saturated always.

Also, when $d^2(Q_{sat}(t))/dt^2<0$ in the period from t(m) to t(n) for amount S(m) of light, the photoelectric conversion efficiency becomes discontinuous and an image that gives uncomfortable feeling to eyes is produced.

Further, in this embodiment, it is basically desirable that the amount of charge accumulated into the charge accumulating means just before the concerned one imaging period starts is made to be substantially zero. In some cases, as shown by a dashed curve in FIGS. 17(a) and (b), it is preferable that a predetermined amount of charge is added intentionally without setting the amount of charge accumulated into the charge accumulating means just before the concerned one imaging period starts to be zero.

Namely, in the above embodiments, when no charge is accumulated into the charge accumulating means at the start point t(0) of the concerned one imaging period, the amount of accumulated charge is likely to disperse. Since the dispersion in amount of accumulated charge at such time point affects strongly the human sense of vision, it may give uncomfortable feeling to eyes. Therefore, to solve this problem, it is desirable that a predetermined charge is given to the charge accumulating means.

For example, to apply a predetermined voltage to the charge accumulating means and to make a predetermined amount of charge remain are applicable.

Thus, in such embodiment, at the start point of one imaging period, the substrate voltage lowers one stage abruptly as shown by the dashed curve in FIG. 17(a).

In the first to fifth embodiments according to the invention, the amount of accumulable charge is varied by the variation of substrate voltage in photoelectric conversion sections with a vertical OFD structure typically used in CCD type solid-state image sensing device. However, the method in the first to fifth embodiments can be also used similarly in photoelectric conversion sections with a horizontal OFD structure. This is explained below.

Figure 19A:
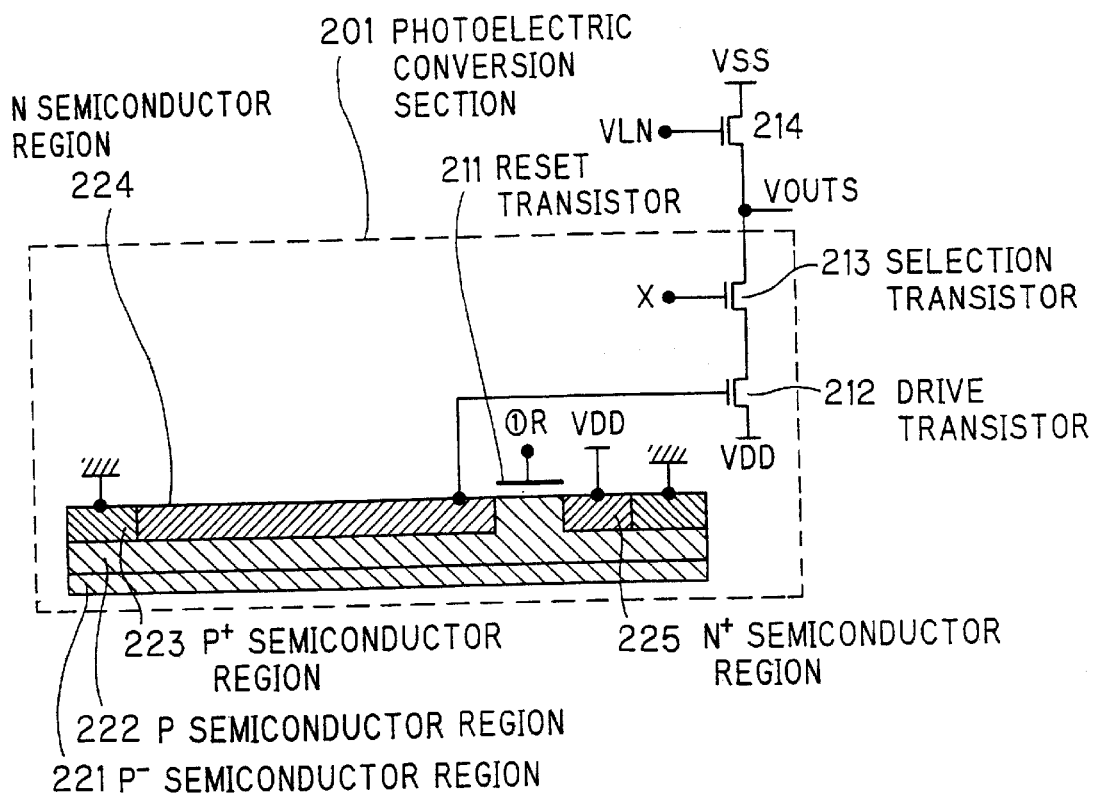
FIG. 19A is a cross sectional view showing a photoelectric conversion section with a horizontal OFD structure used in the solid-state image sensing device of the invention.

FIG. 19A is a cross sectional view showing a photoelectric conversion section typically used in CMOS type solid-state image sensing device. It is composed of a p-type semiconductor substrate 221, a p-type semiconductor region 222, a p$^+$-type semiconductor region 223, a n-type semiconductor region 224, a n$^+$-type semiconductor region 225, a reset transistor 211, and a drive transistor 212 and a selection transistor 213 for source follower circuit.

Figure 19B:
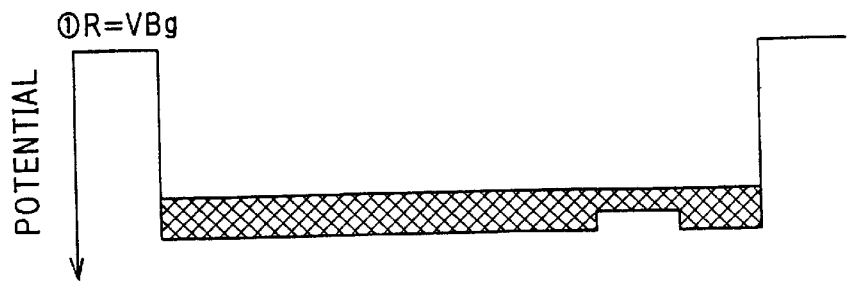
FIGS. 19B and 19C are potential diagrams of the photoelectric conversion section in FIG. 19A.

First, to reset unnecessary charge before one imaging period, by applying a voltage VHg to the reset transistor 211 as shown in FIG. 19B, the potential under the reset transistor 211 is deepened, and the potential of the n-type semiconductor region 224 is set to power-source voltage VDD.

Figure 19C:
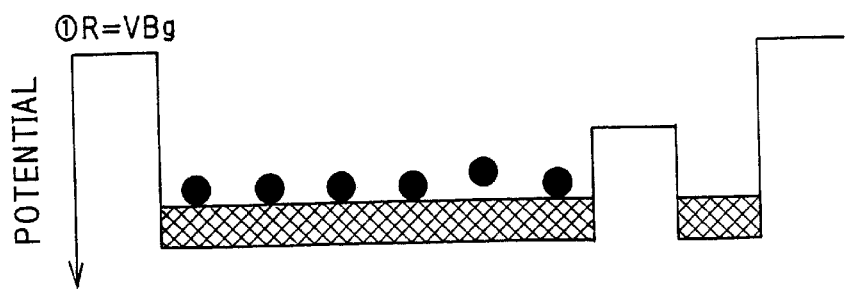

Then, by applying a voltage VBg to the reset transistor 211 as shown in FIG. 19C, a photoelectric conversion section 201 starts accumulating a signal charge according to the amount of incident light, and the blooming control is conducted so that excessive charge which cannot be accumulated in the photoelectric conversion section 201 is removed into the n$^+$-type semiconductor substrate 205 where the power-source voltage VDD is applied using the vertical OFD structure.

Hereupon, the amount of accumulable charge is determined by voltage VBg. So, by varying the VBg within one imaging period. The amount of accumulable charge can be controlled arbitrarily.

As described above, the solid-state image sensing device 1 may comprise a plurality of photoelectric conversion sections that accumulate a signal charge according to the amount of incident light for a predetermined time and are provided with such a vertical OFD structure that by controlling the potential barrier by substrate voltage, an excessive charge is removed into a substrate and an amount of accumulable charge is controlled. Also, the solid-state image sensing device 1 may comprise a plurality of photoelectric conversion sections that accumulate a signal charge according to the amount of incident light for a predetermined time and are provided with such a horizontal OFD structure that by controlling the potential barrier by gate voltage, an excessive charge is removed into an adjacent diffusion layer and an amount of accumulable charge is controlled.

Also, another aspect of the invention is a recording medium that stores a program for conducting the method of driving the solid-state image sensing device using the computer.

ADVANTAGES OF THE INVENTION

As explained above, according to the invention, when amount of accumulable charge varies in the form of two stages within one imaging period, the dynamic range can be significantly improved comparing with the case that the amount of accumulable charge does not vary throughout the one imaging period.

Further, when amount of accumulable charge varies discontinuously in the form of more than two stages, the dynamic range can be significantly improved comparing with the case that the amount of accumulable charge does not vary. Moreover, compared with the case that amount of accumulable charge varies in the form of two stages, even when the photoelectric conversion efficiency varies with the amount of light. Its variation is less and can be set to be close to a continuous variation. Therefore, an image that does not give uncomfortable feeling to eyes can be produced.

Furthermore, when amount of accumulable charge varies continuously, the dynamic range can be significantly improved comparing with the case that the amount of accumulable charge does not vary. Moreover, compared with the case that the amount of accumulable charge varies discontinuously, even when the photoelectric conversion efficiency varies with the amount of light, its variation occurs continuously. Therefore, an image that does not give uncomfortable feeling to eyes can be produced.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A solid-state image sensing device, comprising:
   a plurality of sensing means arrayed in the form of a matrix;
   a charge accumulation means that is connected to said sensing means and accumulates a charge generated at said sensing means;
   an accumulable charge adjusting means that adjusts the amount of accumulable charge of said charge accumulation means; and a control means that controls said accumulable charge adjusting means;

wherein said control means controls said accumulable charge adjusting means to switch said amount of accumulable charge in the order of $Q_{sat}(1)$ and $Q_{sat}(2)$ within one imaging period, while controlling the accumulation modes of $Q_{sat}(1)$ and $Q_{sat}(2)$ to satisfy:

$$Q_{sat}(1)/t(1)<(Q_{sat}(2)-Q_{sat}(1))/(t(2)-t(1)),$$

where $Q_{sat}(1)$ is a first amount of accumulable charge, $Q_{sat}(2)$ is a second amount of accumulable charge, a finish time of accumulation mode of $Q_{sat}(1)$ is t(1) and a finish time of accumulation mode of $Q_{sat}(2)$ corresponding to the end of one imaging period is t(2).

2. A solid-state image sensing device according to claim 1, wherein:

said sensing means is one selected from a CMOS sensing means and a vertical overflow drain type sensing means.

3. A solid-state image sensing device, according to claim 1, wherein:

the amount of accumulable charge is controlled to increase gradually in time series within one imaging period.

4. A solid-state image sensing device according to claim 1, wherein: said control means controls a substrate voltage of said sensing means or a gate voltage of a transistor of a charge extracting means of said sensing means to vary-when varying the amount of accumulable charge.

5. A solid-state image sensing device, according to claim 1, further comprising:

a plurality of photoelectric conversion sections that accumulate a signal charge according to the amount of incident light for a predetermined time and are provided with such a vertical overflow drain structure (OFD) that by controlling a potential barrier by substrate voltage, an excessive charge is removed into a substrate and an amount of accumulable charge is controlled.

6. A solid-state image sensing device, according to claim 1, further comprising:

a plurality of photoelectric conversion sections that accumulate a signal charge according to the amount of incident light for a predetermined time and are provided with such a horizontal overflow drain structure (OFD) that by controlling a potential barrier by gate voltage, an excessive charge is removed into an adjacent diffusion layer and an amount of accumulable charge is controlled.

7. A solid-state image sensing device, according to claim 1, wherein:

said control means controls the amount of accumulable charge to vary continuously or discontinuously in time series within one imaging period and within a given amount of accumulable charge of said sensing means.

8. A method of driving a solid-state image sensing device which comprises a plurality of sensing means arrayed in the form of a matrix, a charge accumulation means that is connected to said sensing means and accumulates a charge generated at said sensing means, an accumulable charge adjusting means that adjusts the amount of accumulable charge of said charge accumulation means, and a control means that controls said accumulable charge adjusting means, said method comprising:

controlling the accumulable charge adjusting means to switch the amount of accumulable charge in the order of $Q_{sat}(1)$ and $Q_{sat}(2)$ within one imaging period, while controlling the accumulation modes of $Q_{sat}(1)$ and $Q_{sat}(2)$ to satisfy:

$$Q_{sat}(1)/t(1)<(Q_{sat}(1)-Q_{sat}(2))/(t(2)-t(1)),$$

where $Q_{sat}(1)$ is a first amount of accumulable charge, $Q_{sat}(2)$ is a second amount of accumulable charge, a finish time of accumulation mode of $Q_{sat}(1)$ is t(1) and a finish time of accumulation mode of $Q_{sat}(2)$ corresponding to the end of one imaging period is t(2).

9. A method of driving a solid-state image sensing device, according to claim 8, wherein:

the amount of charge accumulated into the charge accumulating means just before the concerned one imaging period starts is made to be substantially zero.

10. A method of driving a solid-state image sensing device according to claim 8, further comprising the step of:

adding a predetermined amount of charge into the charge accumulation means before the one imaging period starts.

11. A method of driving a solid-state image sensing device which comprises a plurality of sensing means arrayed in the form of a matrix, a charge accumulation means that is connected to said sensing means and accumulates a charge generated at said sensing means, an accumulable charge adjusting means that adjusts the amount of accumulable charge of said charge accumulation means, and a control means that controls said accumulable charge adjusting means, said method comprising:

controlling the accumulable charge adjusting means to switch said amount of the accumulable charge in the order of $Q_{sat}(1), Q_{sat}(2), \ldots Q_{sat}(n)$ within one imaging period, while switching sequentially from a first amount of accumulable charge ($Q_{sat}(1)\neq 0$) to $n_{th}$ amount of accumulable charge $Q_{sat}(n)$, n being a positive integer, where $Q_{sat}(1)<Q_{sat}(2)< \ldots <Q_{sat}(n)$ is satisfied.

12. A method of driving a solid-state image sensing device according to claim 11, wherein:

the switching of said amount of accumulable charge is conducted to satisfy the relation of $Q_{sat}(m)-Q_{sat}(m-1)/t(m)-t(m-1)<Q_{sat}(m+1)-Q_{sat}(m)/t(m+1)-t(m)$ for a certain integer m or any integer m that is 2 or more and less than n, where t(m) is a time from the start of accumulation to the end of the $m_{th}$ stage ($2 \leq m \leq n$) accumulation mode with an amount $Q_{sat}(m)$ of accumulable charge, and a finish time of one imaging period is t(n).

13. A recording medium that stores a program to make a computer conduct a method of driving a solid-state image sensing device which comprises a plurality of sensing means arrayed in the form of a matrix, a charge accumulation means that is connected to said sensing means and accumulates a charge generated at said sensing means, an accumulable charge adjusting means that adjusts the amount of accumulable charge of said charge accumulation means, and a control means that controls said accumulable charge adjusting means, said method of driving comprising the step of:

controlling the accumulable charge adjusting means to switch the amount of accumulable charge in the order of $Q_{sat}(1)$ and $Q_{sat}(2)$ within one imaging period, while controlling the accumulation modes of $Q_{sat}(1)$ and $Q_{sat}(2)$ to satisfy:

$$Q_{sat}(1)/t(1)<(Q_{sat}(1)-Q_{sat}(2))/(t(2)-t(1)),$$

where $Q_{sat}(1)$ is a first amount of accumulable charge, $Q_{sat}(2)$ is a second amount of accumulable charge, a finish time of accumulation mode of $Q_{sat}(1)$ is $t(1)$ and a finish time of accumulation mode of $Q_{sat}(2)$ corresponding to the end of one imaging period is $t(2)$.

14. A solid-state image sensing device comprising:

a plurality of sensing means arrayed in the form of a matrix;

a charge accumulation means that is connected to said sensing means and accumulates a charge generated at said sensing means;

an accumulable charge adjusting means that adjusts the amount of accumulable charge of said charge accumulation means; and a control means that controls said accumulable charge adjusting means;

wherein said control means controls said accumulable charge adjusting means to switch said amount of accumulable charge in the order of $Q_{sat}(1)$, $Q_{sat}(2)$, ... $Q_{sat}(n)$ within one imaging period, while switching sequentially from a first amount of accumulable charge ($Q_{sat}(1) \neq 0$) to $n_{th}$ amount of accumulable charge $Q_{sat}(n)$, n being a positive integer, where $Q_{sat}(1) < Q_{sat}(2) < ... < Q_{sat}(n)$ is satisfied.

15. A solid-state image sensing device according to claim 14 wherein:

the switching of said amount of accumulable charge is conducted to satisfy the relation of:

$Q_{sat}(m) - Q_{sat}(m-1)/t(m) - t(m-1) < Q_{sat}(m+1) - Q_{sat}(m)/t(m+1) - t(m)$ for a certain integer m that is 2 or more-and less than n, where $t(m)$ is a time from the start of accumulation to the end of the $m_{th}$ stage $2 \leq m \leq n$) accumulation mode with an amount $Q_{sat}(m)$ of accumulable charge, and a finish time of one imaging period is $t(n)$.

* * * * *

UNITED STATES PATENT AND TRADEMARK OFFICE
CERTIFICATE OF CORRECTION

PATENT NO. : 6,486,460 B1
DATED : November 26, 2002
INVENTOR(S) : Ichiro Murakami and Yasutaka Nakashiba It is certified that error appears in the above-identified patent and that said Letters Patent is hereby corrected as shown below:

Column 2,
Line 28, delete "chat" and insert -- that --

Column 6,
Lines 64 & 65, delete "$Q_{sat}(1)/t(1)<(Q_{sat}(2)Q_{sat}(1)/t(^2)-t(1))$" insert -- $Q_{sat}(1) / + (1) < (Q_{sat}(2) -Q(1)) / (+ (2) - +(1) )$ --

Column 7,
Line 28, after "Namely," delete "." insert -- , --;
Line 44, delete "5(2)" insert -- S(2) --

Column 8,
Line 51, delete "chat" insert -- that --

Column 9,
Line 14, delete "$(2) -+(1)= ...= +(m)-+(m-1)=...(n)-+(n-1)$" insert -- $t(1) = t(2) - t(1) =..... t(n) - t(n-1)$ --

Signed and Sealed this

Fifteenth Day of April, 2003

JAMES E. ROGAN
*Director of the United States Patent and Trademark Office*